United States Patent
Cheng et al.

(10) Patent No.: US 12,495,587 B2
(45) Date of Patent: Dec. 9, 2025

(54) SELF-ALIGNED CONTACT (SAC) IN NANOSHEET TRANSISTORS

(71) Applicant: INTERNATIONAL BUSINESS MACHINES CORPORATION, Armonk, NY (US)

(72) Inventors: Kangguo Cheng, Schenectady, NY (US); Ruilong Xie, Niskayuna, NY (US); Julien Frougier, Albany, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 647 days.

(21) Appl. No.: 17/654,243

(22) Filed: Mar. 10, 2022

(65) Prior Publication Data

US 2023/0290821 A1    Sep. 14, 2023

(51) Int. Cl.
*H10D 62/10*    (2025.01)
*H10D 30/01*    (2025.01)
*H10D 30/67*    (2025.01)
*H10D 84/01*    (2025.01)
*H10D 84/03*    (2025.01)

(52) U.S. Cl.
CPC ......... *H10D 62/118* (2025.01); *H10D 30/031* (2025.01); *H10D 30/6713* (2025.01); *H10D 30/6735* (2025.01); *H10D 30/6757* (2025.01); *H10D 62/115* (2025.01); *H10D 84/0128* (2025.01); *H10D 84/013* (2025.01); *H10D 84/0147* (2025.01); *H10D 84/0151* (2025.01); *H10D 84/038* (2025.01)

(58) Field of Classification Search
CPC .......... H01L 29/66515; H01L 29/0673; H01L 29/0653; H01L 29/42392; H01L 29/66545; H01L 29/41783; H10D 64/017; H10D 30/024; H10D 62/118; H10D 62/115
See application file for complete search history.

(56) References Cited

U.S. PATENT DOCUMENTS 10,083,963 B2    9/2018    Goktepeli
2019/0326395 A1*  10/2019    Ando ................... H10D 64/017
(Continued)

*Primary Examiner* — Yara B Green
*Assistant Examiner* — Coralie A Nettles
(74) *Attorney, Agent, or Firm* — Edward J. Wixted, III

(57) ABSTRACT

Embodiments of the invention include a method for fabricating a semiconductor device and the resulting structure. A nanosheet stack of alternating nanosheets of a sacrificial semiconductor material nanosheet and a semiconductor channel material nanosheet and a dielectric nanosheet as a top layer of the nanosheet stack is provided above a semiconductor substrate. A dummy gate with a gate cap and spacers on the sidewalls straddle over the nanosheet stack. End portions of the sacrificial semiconductor material nanosheets are recessed. A dielectric spacer material layer is formed. A source/drain region is formed on the sidewalls of each semiconductor channel material nanosheet. The dummy gate and gate cap are removed. Each sacrificial semiconductor material nanosheet is removed. A functional gate structure is formed that wraps around each suspended semiconductor channel material nanosheet. A self-aligned source/drain contact region is formed. A gate contact region is formed in a trench in the semiconductor substrate.

20 Claims, 16 Drawing Sheets

(56) References Cited

U.S. PATENT DOCUMENTS

| | | |
|---|---|---|
| 2020/0294998 A1 | 9/2020 | Lilak |
| 2020/0395446 A1* | 12/2020 | Yi .......................... B82Y 10/00 |
| 2021/0305381 A1 | 9/2021 | Chiang |
| 2021/0336012 A1 | 10/2021 | Huang |
| 2021/0343646 A1 | 11/2021 | Chen |
| 2021/0343853 A1 | 11/2021 | Chung |
| 2021/0375691 A1 | 12/2021 | Chen |
| 2021/0391421 A1 | 12/2021 | Chu |
| 2021/0399099 A1 | 12/2021 | Chu |
| 2022/0278196 A1* | 9/2022 | Kuang ............... H10D 30/6211 |
| 2022/0293595 A1* | 9/2022 | Kim ....................... H10D 30/43 |
| 2022/0310603 A1* | 9/2022 | Huang ............... H10D 30/6211 |
| 2023/0178436 A1* | 6/2023 | Gardner ................ H10D 30/43 |

\* cited by examiner

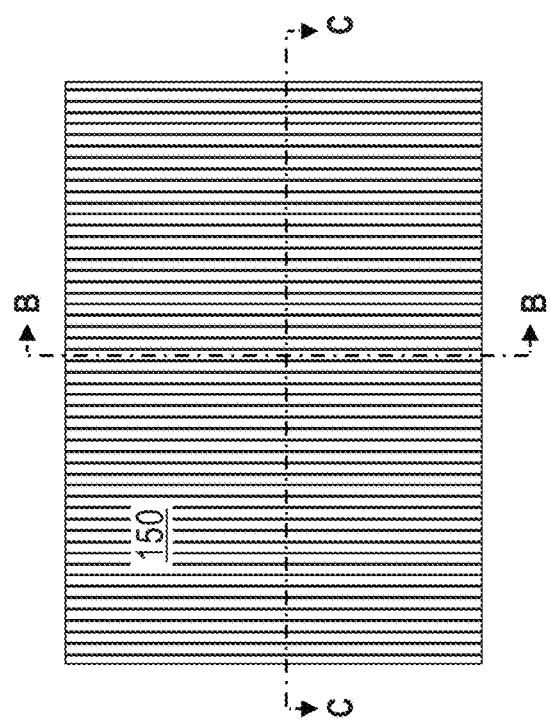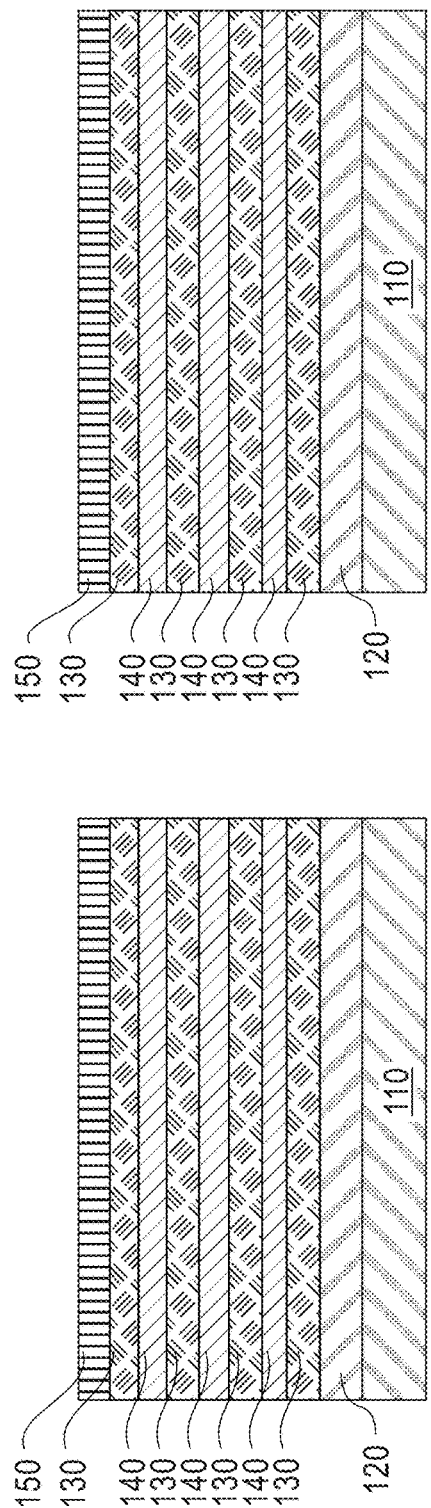

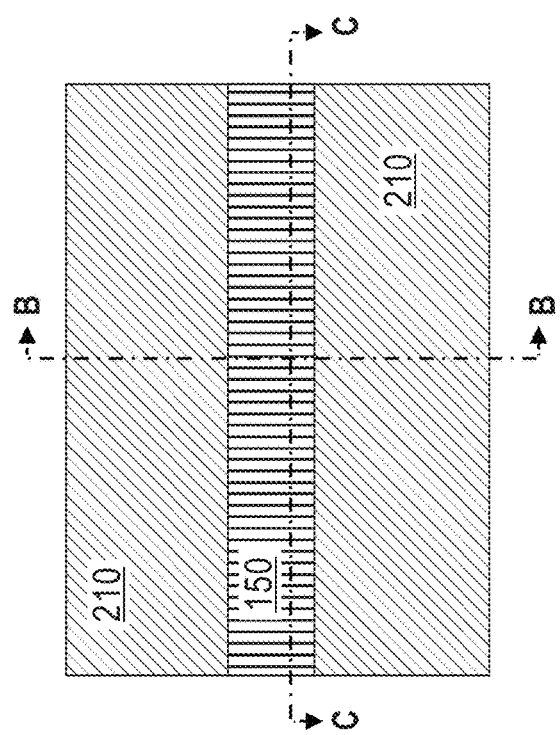
FIG. 2A
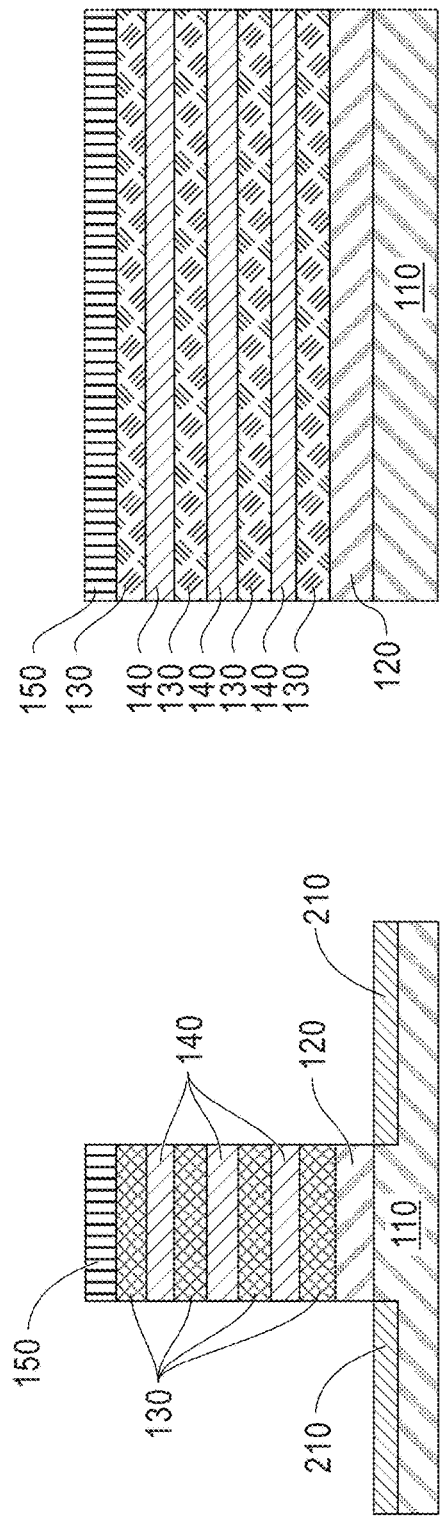
FIG. 2C
FIG. 2B

SELF-ALIGNED CONTACT (SAC) IN NANOSHEET TRANSISTORS

BACKGROUND

The present invention relates generally to the field of semiconductor devices and fabrication, and more particularly to the fabrication of a nanosheet transistor device with improved self-aligned contact (SAC) patterning robustness and reduced parasitic capacitance.

The use of non-planar semiconductor devices such as, for example, semiconductor fin field effect transistors (FinFETs) is the next step in the evolution of complementary metal oxide semiconductor (CMOS) devices. One type of non-planar semiconductor device that has been touted as a viable option beyond the 7 nm technology node is a nanosheet containing device. By "nanosheet containing device" it is meant that the device contains one or more layers of semiconductor channel material portions having a vertical thickness that is substantially less than its width.

Nanosheet formation relies on the selective removal of one semiconductor material (e.g., silicon) to another semiconductor material (e.g., a silicon germanium alloy) to form suspended nanosheets for gate-all-around devices. Source/drain (S/D) regions for nanosheet containing devices are currently formed by epitaxial growth of a semiconductor material upwards from an exposed surface of the semiconductor substrate and from sidewalls of each nanosheet.

SAC is a semiconductor process flow technique that adds a protective dielectric layer over the transistor gate in order to prevent contact-to-gate shorts.

SUMMARY

Embodiments of the invention include a method for fabricating a semiconductor device and the resulting structure. The method can include providing a nanosheet stack of (i) alternating nanosheets of a sacrificial semiconductor material nanosheet and a semiconductor channel material nanosheet and (ii) a dielectric nanosheet as a top layer of the nanosheet stack, the nanosheet stack located above a semiconductor substrate, wherein a dummy gate with a gate cap and spacers on sidewalls of the dummy gate and the gate cap straddle over the nanosheet stack. The method can also include recessing end portions of each of the sacrificial semiconductor material nanosheets to provide a gap between each of the semiconductor channel material nanosheets. The method can also include forming a dielectric spacer material layer within each gap. The method can also include forming a source/drain region by epitaxial growth of a semiconductor material on physically exposed sidewalls of each semiconductor channel material nanosheet. The method can also include removing the dummy gate and the gate cap. The method can also include removing each sacrificial semiconductor material nanosheet to suspend each semiconductor channel material nanosheet and the dielectric nanosheet. The method can also include forming a functional gate structure in regions occupied by each sacrificial semiconductor material nanosheet, where the functional gate structure wraps around each suspended semiconductor channel material nanosheet. The method can also include forming a self-aligned contact region, where the self-aligned contact region contacts the source/drain region and is laterally adjacent to the spacers and the dielectric nanosheet. The method can also include forming a gate contact region in a trench in the semiconductor substrate, the gate contact region contacting the functional gate structure.

BRIEF DESCRIPTION OF THE DRAWINGS

FIG. 1A depicts a top-down view, FIG. 1B depicts a cross-sectional view, along section line B of FIG. 1A, and FIG. 1C depicts a cross-sectional view, along section line C of FIG. 1A, of a semiconductor substrate and semiconductor material stack upon which embodiments of the present invention can be fabricated, in accordance with an embodiment of the invention.

FIG. 2A depicts a top-down view, FIG. 2B depicts a cross-sectional view, along section line B of FIG. 2A, and FIG. 2C depicts a cross-sectional view, along section line C of FIG. 2A, of a process of patterning a nanosheet stack and forming a shallow trench isolation layer, in accordance with an embodiment of the invention.

DETAILED DESCRIPTION

Figure 3A:
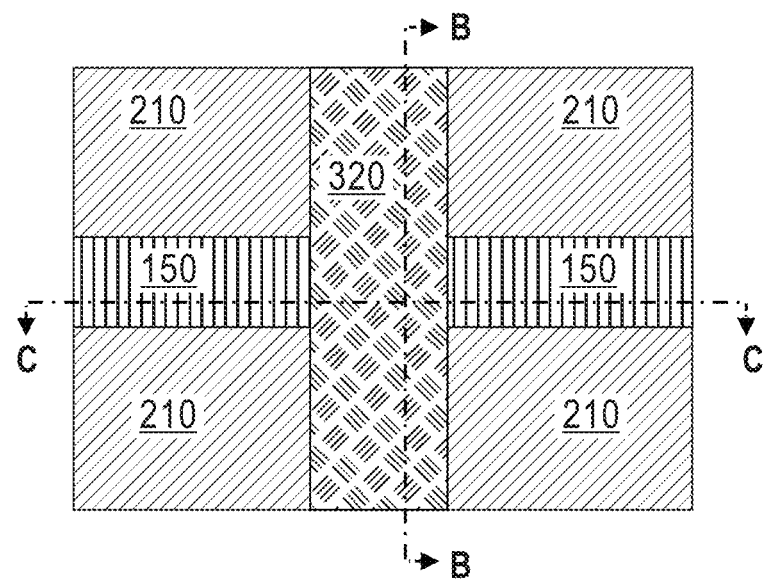
FIG. 3A depicts a top-down view.

Embodiments of the present invention recognize that in current nanosheet transistors, there is large parasitic capacitance between the metal gate and self-aligned source/drain contact. Embodiments of the present invention further recognize that, in current nanosheet transistors, potential yield and reliability problems can occur due to corner erosion of self-aligned contact (SAC) cap(s).

Embodiments of the present invention describe an approach for fabricating a nanosheet transistor, the approach including forming a nanosheet stack with a dielectric sheet on top, forming a gate around the nanosheet, forming a dielectric cap on top of the gate, forming self-aligned contacts to the source/drain region, and forming a gate contact on the backside of the wafer. Embodiments of the present invention describe a nanosheet transistor that includes a dielectric nanosheet on top of a semiconductor nanosheet, self-aligned contacts to the source/drain, and a gate contact on the wafer backside, the backside gate contact compatible with a backside power rail distribution network. Embodiments of the present invention recognize that such an approach and device improves the robustness of SACs and results in a much thicker SAC cap. Embodiments of the present invention further recognizes that providing a dielectric nanosheet on top, and thus only enabling metal gate at the nanosheet level, improves nanosheet device performance and reduces power consumption by reducing the parasitic capacitance between the metal gate and the source/drain region.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Each reference number may refer to an item individually or collectively as a group. For example, sacrificial semiconductor material layer 130 may refer to a single sacrificial semiconductor material layer 130 or multiple sacrificial semiconductor material layers 130.

The present invention will now be described in detail with reference to the Figures.

FIG. 1A depicts a top-down view of a device at an early stage in the method of forming the device, FIG. 1B depicts a cross-sectional view along section line B of FIG. 1A and FIG. 1C depicts a cross-sectional view along section line C of FIG. 1A, in accordance with an embodiment of the present invention.

The semiconductor structure of FIGS. 1A-C includes a semiconductor substrate upon which embodiments of the invention can be fabricated. Semiconductor substrate 110 may be composed of a silicon containing material. Silicon containing materials include, but are not limited to, silicon, single crystal silicon, polycrystalline silicon, SiGe, single crystal SiGe, polycrystalline SiGe, or silicon doped with carbon (C), amorphous silicon, and combinations and multilayers thereof. Semiconductor substrate 110 can also be composed of other semiconductor materials, such as germanium (Ge), and compound semiconductor substrates, such as type III/V semiconductor substrates, e.g., gallium arsenide (GaAs). In general, semiconductor substrate 110 is a smooth surface substrate. In some embodiments (not shown), semiconductor substrate 110 can be a partially processed complementary metal-oxide semiconductor (CMOS) integrated wafer with transistors and wiring levels or gate electrodes embedded beneath the surface.

In some embodiments a bottom sacrificial semiconductor material layer 120 is atop semiconductor substrate 110. The bottom sacrificial semiconductor material layer 120 may be composed of SiGe, silicon oxide, or rare earth oxides, as known in the art. The bottom sacrificial semiconductor material layer 120 differs in composition from at least an upper portion of semiconductor substrate 110. In one embodiment, the upper portion of the semiconductor substrate 110 is composed of silicon, while the bottom sacrificial semiconductor material layer 120 is composed of silicon germanium. In such an embodiment, the silicon germanium alloy content of bottom sacrificial semiconductor material layer 120 may have a germanium content that is, for example, about fifty atomic percent germanium. In one example, the SiGe alloy that makes up bottom sacrificial semiconductor material layer 120 has a germanium content from twenty atomic percent germanium to sixty atomic percent germanium. The bottom sacrificial semiconductor material layer 120 can be formed utilizing an epitaxial growth or deposition process.

A semiconductor material stack (130, 140) is formed upon bottom sacrificial semiconductor material layer 120. The semiconductor material stack includes vertically aligned alternating layers of sacrificial semiconductor material layer 130 and semiconductor channel material layer 140. The semiconductor material stack is sequentially formed upon bottom sacrificial semiconductor material layer 120. As mentioned above, the semiconductor material stack includes sacrificial semiconductor material layers 130 and semiconductor channel material layers 140, which alternate one atop the other. In FIG. 1, and only by way of one example, the semiconductor material stack includes four layers of sacrificial semiconductor material layer 130 and three layers of semiconductor channel material layer 140. The semiconductor material stacks that can be employed in embodiments of the present invention are not limited to the specific embodiment illustrated in FIG. 1. Instead, the semiconductor material stack can include any number of sacrificial semiconductor material layers 130 and semiconductor channel material layers 140. The semiconductor material stack is used to provide a gate-all-around device that includes vertically stacked semiconductor channel material nanosheets for a p-channel field-effect transistor (pFET) or n-channel field-effect transistor (nFET) device.

Each sacrificial semiconductor material layer 130 is composed of a first semiconductor material which differs in composition from at least bottom sacrificial semiconductor material layer 120 and semiconductor channel material layer 140. In one embodiment, the upper portion of the semiconductor substrate 110 is composed of silicon, while each sacrificial semiconductor material layer 130 is composed of silicon germanium. In such an embodiment, the silicon germanium alloy content of bottom sacrificial semiconductor material layer 120 may have a germanium content that is less than fifty atomic percent germanium. In one example, the SiGe alloy that makes up bottom sacrificial semiconductor material layer 120 has a germanium content from twenty atomic percent germanium to forty atomic percent germanium. In general, the SiGe alloy that makes up bottom sacrificial semiconductor material layer 120 has a germanium content that is less than that of sacrificial semiconductor material layer 130, such that, for example, bottom sacrificial semiconductor material layer 120 can be selectively removed to form a bottom isolation layer. The semiconductor material, for each sacrificial semiconductor material layer 130, can be formed utilizing an epitaxial growth or deposition process.

Each semiconductor channel material layer 140 is composed of a second semiconductor material that has a different etch rate than the first semiconductor material of sacrificial semiconductor material layers 130. The second semiconductor material of each semiconductor channel material layer 140 may be the same as, or different than, the semiconductor material of, at least, the upper portion of semiconductor substrate 110. The second semiconductor material can be, for example, silicon. The second semiconductor material can be a SiGe alloy having a germanium content of 20-50 atomic percent germanium and the first semiconductor material is different than the second semiconductor material. In general, if the second semiconductor material is an SiGe alloy, the germanium content is less than the germanium content of sacrificial semiconductor material layer 130 such that semiconductor material layer 130 can be selectively removed.

In one example, at least the upper portion of semiconductor substrate 110 and each semiconductor channel material layer 140 is composed of Si or a III-V compound semiconductor, while each sacrificial semiconductor material layer 130 and bottom sacrificial semiconductor material layer 120 is composed of a SiGe alloy. The second semiconductor material, for each semiconductor channel material layer 140, can be formed utilizing an epitaxial growth or deposition process.

Semiconductor material stack (130, 140) can be formed by sequential epitaxial growth of alternating layers of the first semiconductor material and the second semiconductor material. Following epitaxial growth of the topmost layer of the semiconductor material stack (120, 130) a patterning process may be used to provide the semiconductor material stack (120, 130) shown in FIG. 1. Patterning may be achieved by lithography and etching as is well known to those skilled in the art.

Hardmask layer 150 may be formed by forming a blanket layer of a hardmask or dielectric material such as, for example, silicon carbon doped oxide (SiCO), silicon dioxide, and/or silicon nitride. Hardmask layer 150 has etch selectivity to semiconductor substrate 110, bottom sacrificial semiconductor material layer 120, sacrificial semiconductor material layer 130, and semiconductor channel material layer 140. Hardmask, layer 150 can be formed by forming a blanket layer of material by any suitable deposition process such as, for example, chemical vapor deposition (CVD) or plasma enhanced chemical vapor deposition (PECVD).

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although a higher temperature typically results in faster deposition, the faster deposition may result in crystal defects and film cracking. The epitaxial growth the first and second semiconductor materials that provide the sacrificial semiconductor material layers and the semiconductor channel material layers, respectively, can be performed utilizing any well-known precursor gas or gas mixture. Carrier gases like hydrogen, nitrogen, helium and argon can be used.

The sacrificial semiconductor material layers 130 that constitutes the semiconductor material stack may have a thickness from 5 nm to 12 nm, while the semiconductor channel material layers 140 that constitute the semiconductor material stack may have a thickness from 6 nm to 12 nm. Each sacrificial semiconductor material layer 130 may have a thickness that is the same as, or different from, a thickness of each semiconductor channel material layer 140. In an embodiment, each sacrificial semiconductor material layer 130 has an identical thickness. In an embodiment, each semiconductor channel material layer 140 has an identical thickness.

FIG. 2A depicts a top-down view of fabrication steps, in accordance with an embodiment of the present invention. FIG. 2B depicts a cross-sectional view along section line B of FIG. 2A and FIG. 2C depicts a cross-sectional view along section line C of FIG. 2A, in accordance with an embodiment of the present invention. FIGS. 2A-C show the patterning of the nanosheet stack and the formation of shallow trench isolation (STI) layer 210.

Hardmask layer 150 may be patterned using lithography and etching such that the top surface of portions of the top layer of sacrificial semiconductor material layer 130 are exposed (not shown). In general, the desired nanosheet stack has a width, along the plane corresponding to section line C of FIG. 2A, that is less than the width of semiconductor substrate 110. Accordingly, hardmask layer 150 is patterned based on the desired width for the nanosheet stack.

The nanosheet stack is patterned by removing physically exposed portions of bottom sacrificial semiconductor material layer 120, sacrificial semiconductor material layer 130, and semiconductor channel material layer 140 that are not protected by hardmask layer 150. During this step of embodiments of the present invention, a portion of the semiconductor substrate 110 may also be removed (e.g., recessed to provide a recessed surface.

The removing of the portions of the semiconductor material stack (e.g., bottom sacrificial semiconductor material layer 120, sacrificial semiconductor material layer 130, and semiconductor channel material layer 140) and semiconductor substrate 110 can be performed utilizing an anisotropic etching process such as, for example, reactive ion etching (RIE). Portions of the semiconductor stack (e.g., bottom sacrificial semiconductor material layer 120, sacrificial semiconductor material layer 130, and semiconductor channel material layer 140) remain beneath hardmask layer 150. The remaining portion of the semiconductor material stack that is presented beneath the hardmask layer 150 is referred to as a nanosheet stack.

Each nanosheet stack includes alternating nanosheets of remaining portions of bottom sacrificial semiconductor material layer 120, remaining portions of each sacrificial semiconductor material layer 130, and remaining portions of each semiconductor channel material layer 140. Each nanosheet (e.g., sacrificial semiconductor material layer 130 or semiconductor channel material layer 140) that constitutes the nanosheet stack has a thickness as mentioned above for the individual sacrificial semiconductor material layers 130 and semiconductor channel material layers 140, and a width from 30 nm to 200 nm. In some embodiments, as illustrated in FIG. 2B, the sidewalls of each sacrificial semiconductor material layer 130 are vertically aligned to sidewalls of each semiconductor channel material layer 140, and the vertically aligned sidewalls of the nanosheet stack are vertically aligned to an outmost sidewall of hardmask layer 150.

FIGS. 2A-2B also illustrate STI layer 210 formed on exposed portions of semiconductor substrate 110. The STI layer 210 can be formed by any suitable process such as, for example, depositing an insulating (dielectric) material, such as silicon dioxide. Following the deposition of STI layer 210, an additional etching process can be performed to remove portions of STI layer 210 and expose the top surface of hardmask layer 150. In some embodiments, STI layer 210 is deposited such that a top surface of STI layer 210 is coplanar with a top surface of semiconductor substrate 110.

Figure 3B:
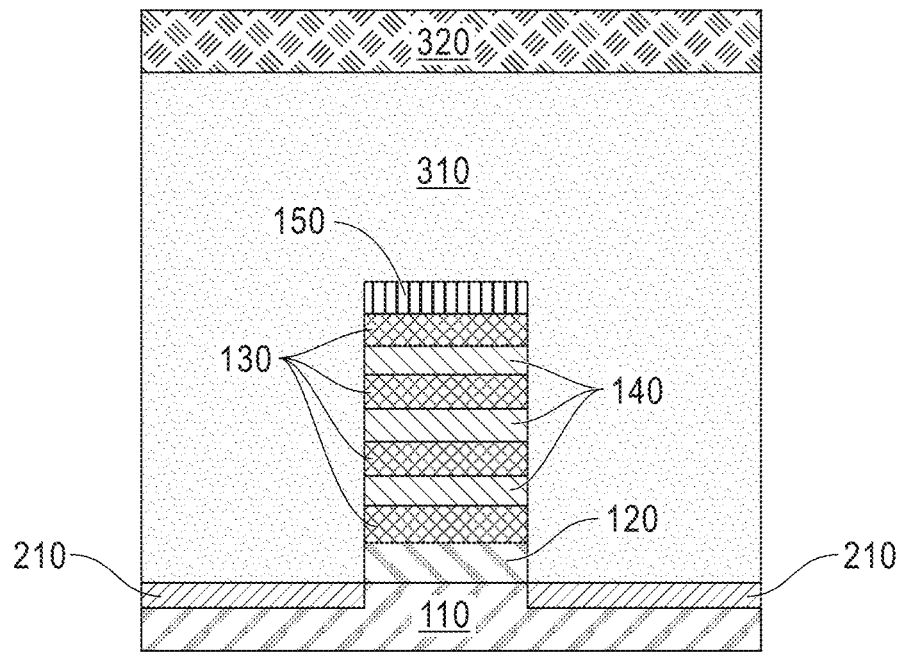
FIG. 3B depicts a cross-sectional view, along section line B of FIG. 3A.
Figure 3C:
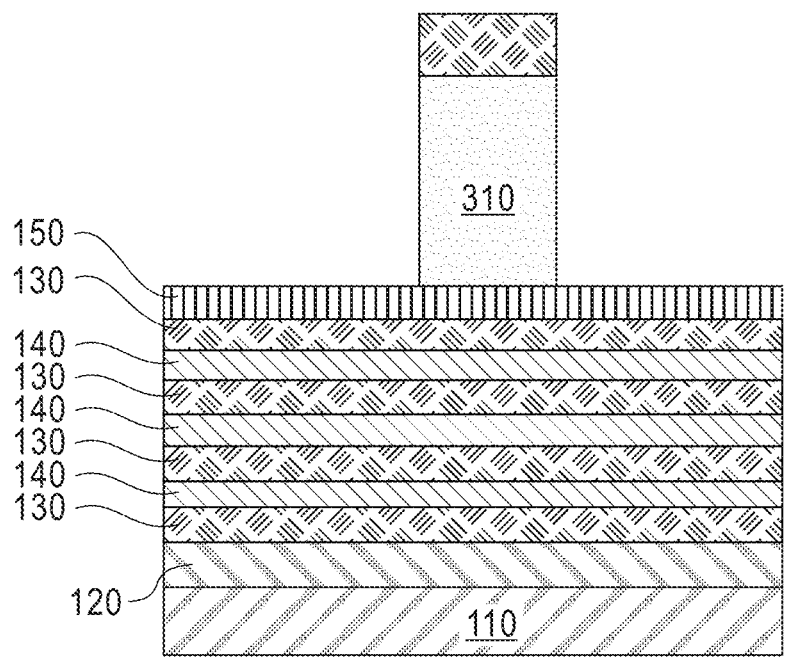
FIG. 3C depicts a cross-sectional view, along section line C of FIG. 3A, of a process of forming a dummy gate and gate cap, in accordance with an embodiment of the present invention.

FIG. 3A depicts a top-down view of fabrication steps, in accordance with an embodiment of the present invention. FIG. 3B depicts a cross-sectional view along section line B of FIG. 3A and FIG. 3C depicts a cross-sectional view along section line C of FIG. 3A, in accordance with an embodiment of the present invention. FIGS. 3A-C show the formation of dummy gate 310 and gate cap 320.

By way of illustration, a single dummy gate 310 is depicted in the drawings of the present application. Dummy gate 310 is located on a first side and a second side of the nanosheet and spans across a topmost surface of a portion of the nanosheet. Dummy gate 310 thus straddles over a portion of the nanosheet stack. In one embodiment, dummy gate 310 can be formed by first depositing a blanket layer of a dummy gate dielectric material and then depositing a blanket layer of dummy gate material. The dummy gate dielectric material can be an oxide, nitride, and/or oxynitride. In one example, the dummy gate dielectric material can be a high-k material having a dielectric constant greater than silicon dioxide. In some embodiments, a multilayered dielectric structure comprising different dielectric materials, e.g., silicon dioxide, and a high-K dielectric can be formed and used as the dummy gate 310. The dummy gate dielectric material can be formed by any deposition technique including, for example, chemical vapor deposition (CVD), plasma enhanced chemical vapor deposition (PECVD), physical vapor deposition (PVD), sputtering, or atomic layer deposition (ALD).

After forming the blanket layer of dummy gate dielectric material, a blanket layer of a dummy gate material can be formed on the blanket layer of dummy gate dielectric material. The dummy gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The dummy gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of dummy gate material, gate cap 320 can be formed using a blanket layer of a gate cap material. The gate cap material may include a hard mask material such as, for example, silicon dioxide and/or silicon nitride. The gate cap material can be formed by any suitable deposition process such as, for example, chemical vapor deposition (CVD) or plasma enhanced chemical vapor deposition (PECVD).

Gate cap 320 may be patterned using lithography and etching such that the top surface of portions of the dummy gate 310 are exposed. In general, the desired dummy gate has a width, along the plane corresponding to section line B of FIG. 3A, that is less than the width of hardmask layer 150 and STI layer 210. Accordingly gate cap 320 is patterned based on the desired width for the dummy gate 310.

The dummy gate 310 is patterned by removing physically exposed portions of dummy gate 310 that are not protected by gate cap 320.

Figure 4A:
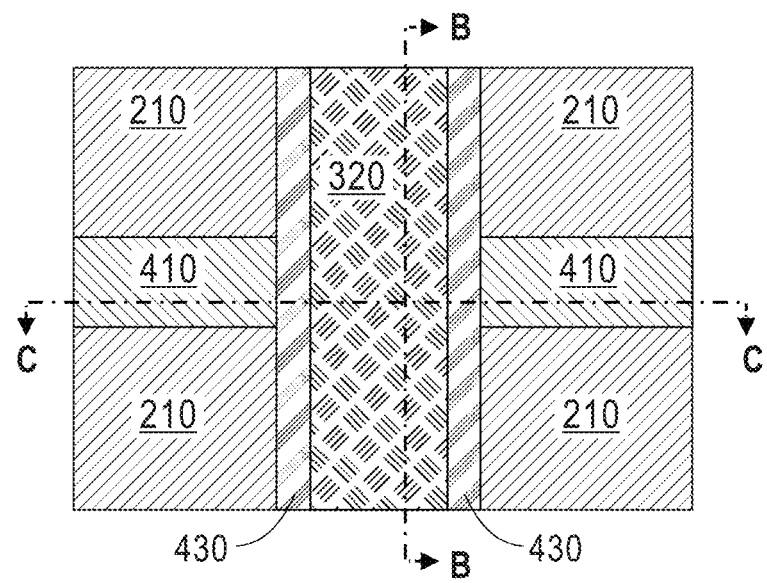
FIG. 4A depicts a top-down view.
Figure 4B:
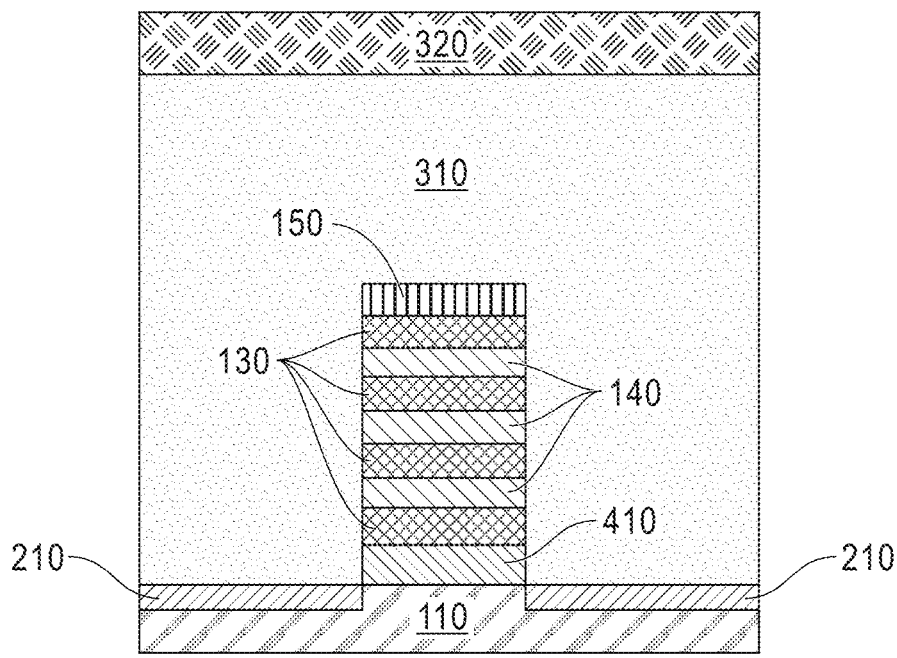
FIG. 4B depicts a cross-sectional view, along section line B of FIG. 4A.
Figure 4C:
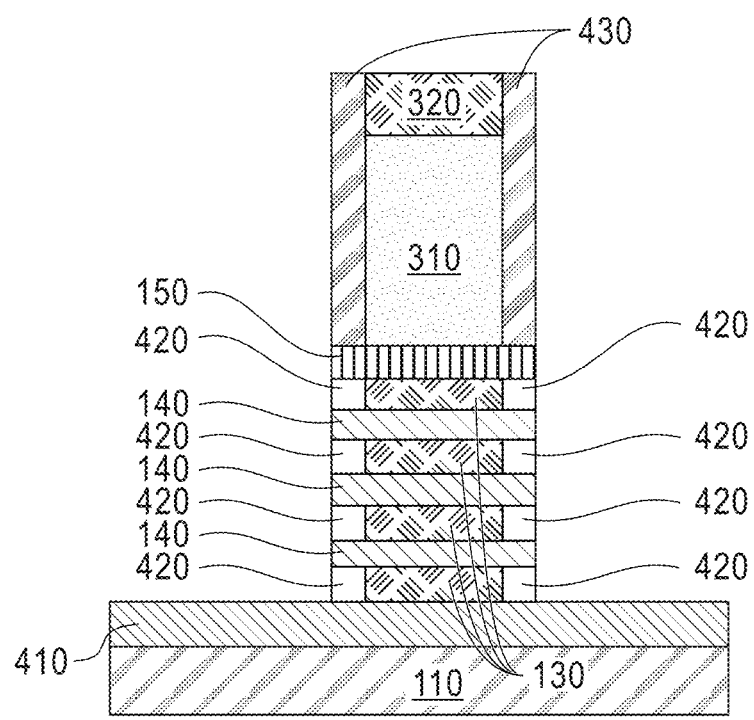
FIG. 4C depicts a cross-sectional view, along section line C of FIG. 4A, of a process removing a bottom sacrificial semiconductor material layer and forming a bottom isolation layer, in accordance with an embodiment of the present invention.

FIG. 4A depicts a top-down view of fabrication steps, in accordance with an embodiment of the present invention. FIG. 4B depicts a cross-sectional view along section line B of FIG. 4A and FIG. 4C depicts a cross-sectional view along section line C of FIG. 4A, in accordance with an embodiment of the present invention. FIGS. 4A-C show the removal of bottom sacrificial semiconductor material layer 120 and subsequent formation of isolation layer 410. FIGS. 4A-C also show the formation of inner spacers 420 and gate spacers 430.

Bottom sacrificial semiconductor material layer 120 is removed to create a cavity by selectively etching bottom sacrificial semiconductor material layer 120 relative to other present layers (e.g., sacrificial semiconductor material layers 130 and semiconductor channel material layers 140).

An isolation layer 410 is then formed in the cavity formed by the removal of bottom sacrificial semiconductor material layer 120. The isolation layer 410 is atop semiconductor substrate 110 and may be composed of silicon oxide, silicon nitride, silicon oxynitride, rare earth oxides, or any suitable of those dielectric materials, as known in the art.

Gate spacers 430 may be formed by depositing dielectric spacer material on exposed surfaces and then etching the dielectric spacer material. One example of a dielectric spacer material that may be employed in embodiments of the present invention is silicon nitride. In general, gate spacers 430 may comprise any dielectric spacer material including, for example, a dielectric nitride, dielectric oxide, and/or dielectric oxynitride. More specifically, the gate spacer 430 material may be, for example, SiBCN, SiBN, SiOCN, SiON, SiCO, or SiC. In one example, the dielectric spacer material that comprises gate spacers 430 is composed of a nonconductive low capacitance dielectric material such as SiOCN.

The dielectric spacer material that provides the gate spacers 430 may be provided by a deposition process including, for example, chemical vapor deposition (CVD), plasma enhanced chemical vapor deposition (PECVD), or atomic layer deposition (ALD). The etch used to provide the gate spacers 430 may comprise a dry etching process such as, for example, reactive ion etching.

In order to create gate spacers 430, horizontal portions of the dielectric spacer material layer are removed. More particularly, portions of dielectric spacer material on the top surfaces of gate cap 320 and hardmask layer 150 are removed such that what remains of the dielectric spacer material layer is present on the sidewalls of gate cap 320 and dummy gate 310, forming gate spacers 430. The dielectric spacer material layer may be removed utilizing a directional or anisotropic etching process such as reactive ion etching (RIE). In one example, gas cluster ion beam etching (IBE) may be used to remove the dielectric spacer material layer from the top surfaces of gate cap 320 and hardmask layer 150. The removal of the dielectric spacer material layer, the top surfaces of gate cap 320 and hardmask layer 150 re-exposes the top surfaces of gate cap 320 and hardmask layer 150.

Subsequent to the formation of gate spacers 430, exposed portions that are not protected by gate cap 320 or gate spacers 430 are removed, exposing a top surface of isolation layer 410.

The removing of the portions of sacrificial semiconductor material layer 130, semiconductor channel material layer 140, and hardmask layer 150 can be performed utilizing an anisotropic etching process such as, for example, reactive ion etching (RIE). Portions of sacrificial semiconductor material layer 130, semiconductor channel material layer 140, and hardmask layer 150 remain beneath the gate cap and gate spacer as a nanosheet stack.

FIG. 4C also depicts the recessing of sacrificial semiconductor material layer 130 and formation of inner spacers 420.

Each recessed sacrificial semiconductor material layer 130 has a width that is less than the original width of each sacrificial semiconductor material layer 130. The recessing of each sacrificial semiconductor material layer 130 provides a gap (not specifically shown) between each neighboring pair of semiconductor channel material layer 140 within a given nanosheet stack (and, as applicable, between a semiconductor channel material layer 140 and a neighboring (i) hardmask layer 150 or (ii) isolation layer 410). The recessing of each sacrificial semiconductor material layer 130 may be performed utilizing a lateral etching process that is selective in removing physically exposed end portions of each sacrificial semiconductor material layer 130 relative to each semiconductor channel material layer 140, hardmask layer 150, and isolation layer 410.

The additional dielectric spacer material that is added to form inner spacers 420 may, in some embodiments, be compositionally the same as the gate spacers 430 mentioned above. In other embodiments, inner spacers 420 are composed of a different material than gate spacers 430. In one example, inner spacers 420 and gate spacers 430 are both composed of silicon nitride. The additional dielectric spacer material can be formed utilizing one of the deposition processes mentioned above in forming the dielectric spacer material layer 220.

Figure 5A:
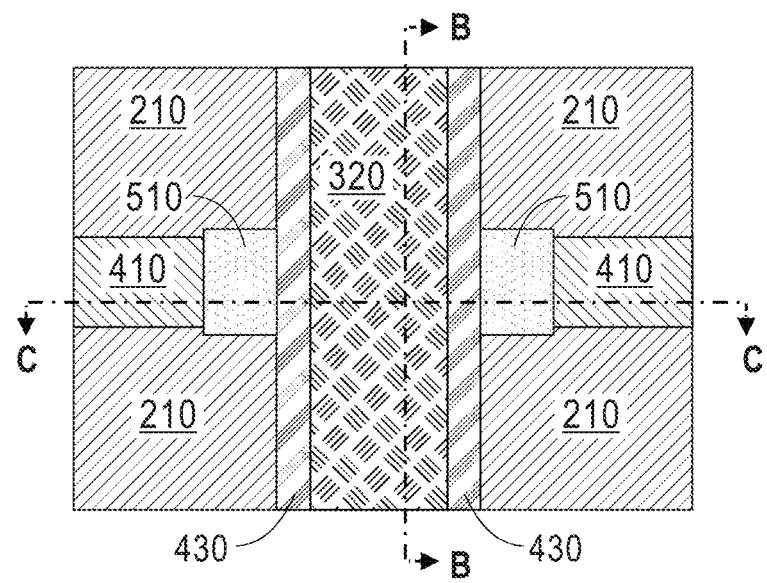
FIG. 5A depicts a top-down view.
Figure 5B:
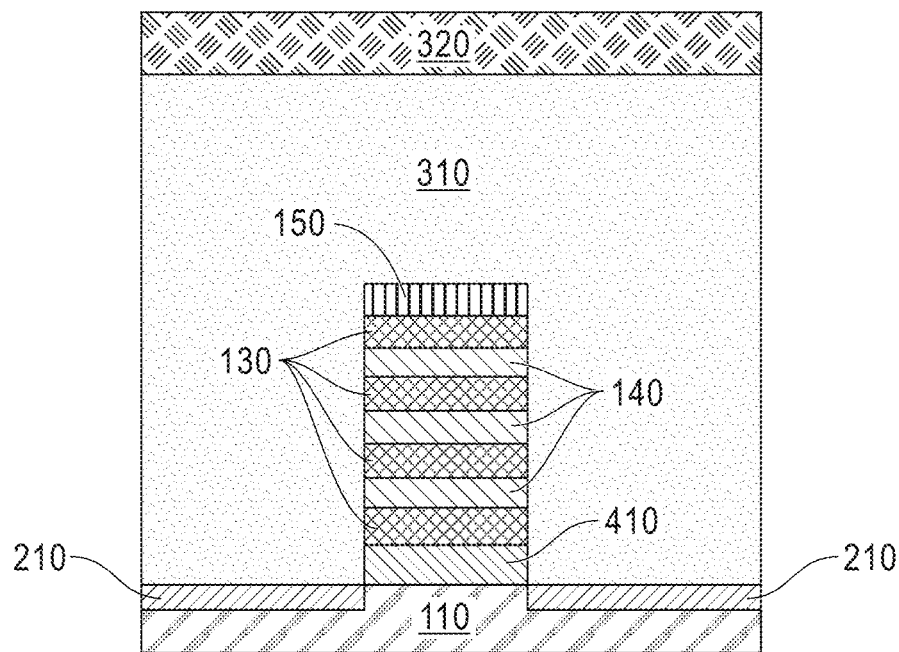
FIG. 5B depicts a cross-sectional view, along section line B of FIG. 5A.
Figure 5C:
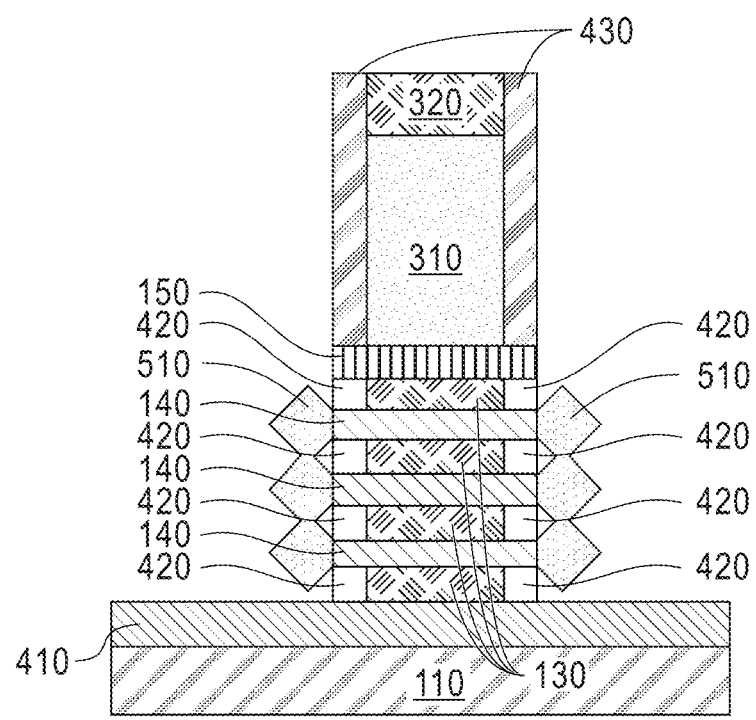
FIG. 5C depicts a cross-sectional view, along section line C of FIG. 5A, of a process of forming a source/drain region, in accordance with an embodiment of the present invention.

FIG. 5A depicts a top-down view of fabrication steps, in accordance with an embodiment of the present invention. FIG. 5B depicts a cross-sectional view along section line B of FIG. 5A and FIG. 5C depicts a cross-sectional view along section line C of FIG. 5A, in accordance with an embodiment of the present invention. FIGS. 5A-C depict the formation of source/drain region 510 on isolation layer 410 and along the sidewalls of the nanosheet stack.

Source/drain region 510 is formed by epitaxial growth of a semiconductor material on physically exposed sidewalls of each semiconductor channel material layer 140. In the present application, the semiconductor material that provides the source/drain region 510 grows laterally out from the sidewalls of each semiconductor channel material layer 140. The source/drain region 510 has a bottommost surface that directly contacts a topmost surface of isolation layer 410.

Each source/drain region 510 includes a semiconductor material and a dopant. The semiconductor material that provides each source/drain region 510 can be selected from one of the semiconductor materials mentioned above for the semiconductor substrate 110. In some embodiments, the semiconductor material that provides each source/drain region 510 may comprise a same semiconductor material as that which provides semiconductor channel material layer 140. In other embodiments, the semiconductor material that provides each source/drain region 510 may comprise a different semiconductor material than that which provides semiconductor channel material layer 140. For example, the semiconductor material that provides each source/drain region 510 may comprise a silicon germanium alloy, which semiconductor channel material layer 140 may comprise silicon.

The dopant that is present in each source/drain region 510 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment, the dopant that can be present in each source/drain region 510 can be introduced into the precursor gas that provides each source/drain region 510. In another embodiment, the dopant can be introduced into an intrinsic semiconductor layer by utilizing one of ion implantation or gas phase doping. In one example, each source/drain region 510 comprises a silicon germanium alloy that is doped with a p-type dopant such as, for example, boron. As mentioned above, each source/drain region 510 is formed by an epitaxial growth (or deposition) process, as is defined above.

Figure 6A:
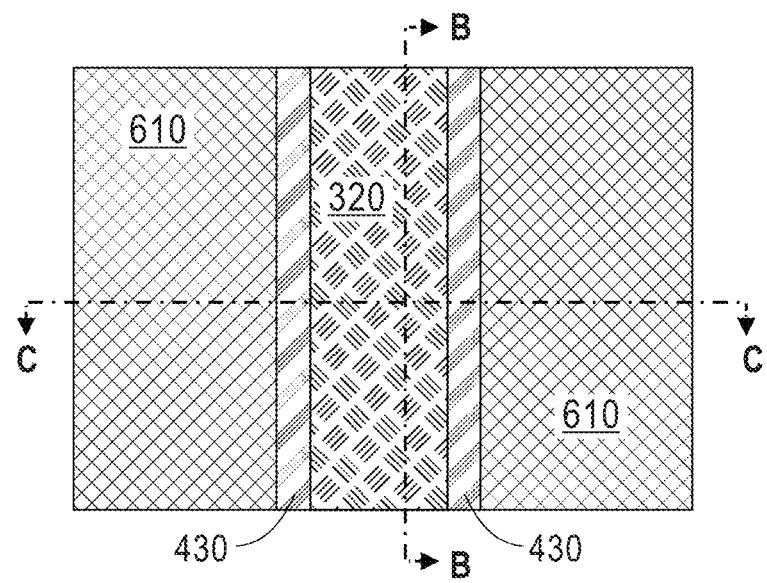
FIG. 6A depicts a top-down view.
Figure 6B:
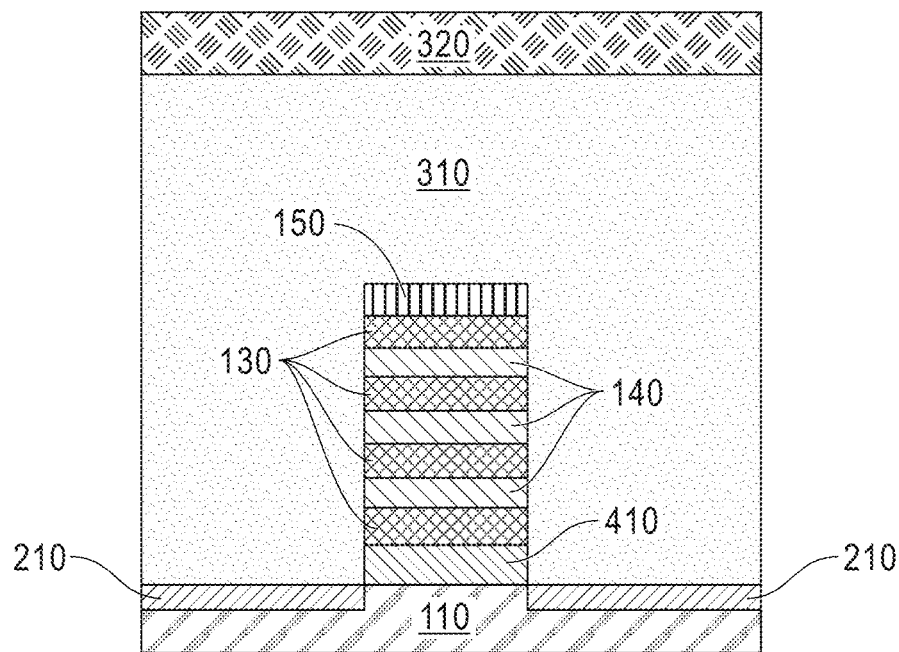
FIG. 6B depicts a cross-sectional view, along section line B of FIG. 6A.
Figure 6C:
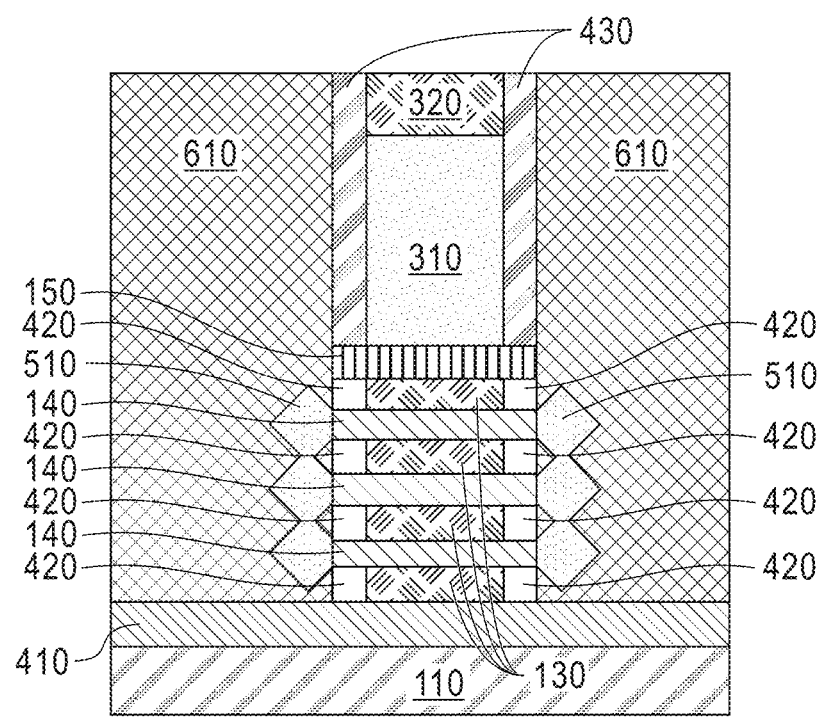
FIG. 6C depicts a cross-sectional view, along section line C of FIG. 6A, of a process of forming interlevel dielectric (ILD) material, in accordance with an embodiment of the present invention.

FIG. 6A depicts a top-down view of fabrication steps, in accordance with an embodiment of the present invention. FIG. 6B depicts a cross-sectional view along section line B of FIG. 6A and FIG. 6C depicts a cross-sectional view along section line C of FIG. 6A, in accordance with an embodiment of the present invention. FIGS. 6A-C depict the formation if interlevel dielectric (ILD) material 610.

The ILD material 610 is formed above each source/drain region 510, above exposed portions of isolation layer 410, and above exposed portions of STI layer 210.

ILD material 610 may be composed of silicon dioxide, undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. The term "low-κ" as used throughout the present application denotes a dielectric material that has a dielectric constant of less than silicon dioxide. In another embodiment, a self-planarizing material such as a spin-on glass (SOG) or a spin-on low-κ dielectric material such as SiLK™ can be used as ILD material 610. The use of a self-planarizing dielectric material as ILD material 610 may avoid the need to perform a subsequent planarizing step.

In one embodiment, ILD material 610 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD material 610, a planarization process or an etch back process follows the deposition of the dielectric material that provides ILD material 610. As is shown in FIG. 6C, ILD material 610 that is present atop each source/drain region 510 has a topmost surface that is coplanar with a topmost surface of gate cap 320 and gate spacers 430.

Figure 7A:
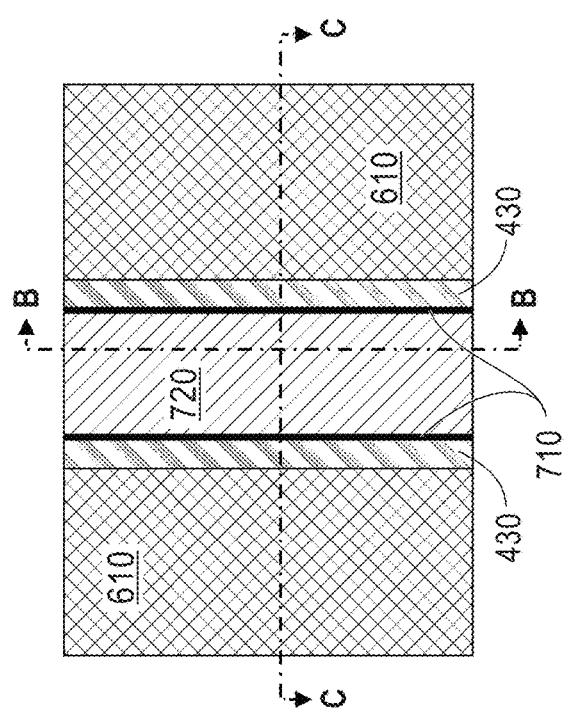
FIG. 7A depicts a top-down view.
Figure 7C:
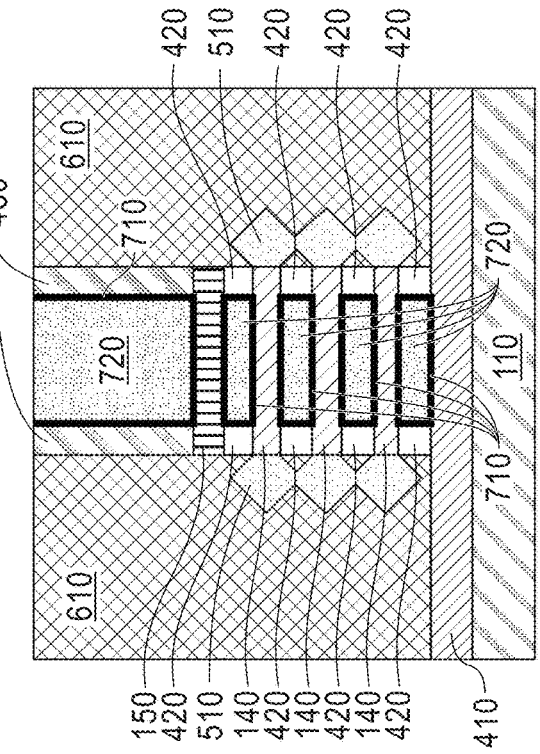
FIG. 7C depicts a cross-sectional view, along section line C of FIG. 7A, of a process of removing a sacrificial gate structure and each recessed sacrificial semiconductor material nanosheet and forming a functional gate structure, in accordance with an embodiment of the present invention.
Figure 7B:
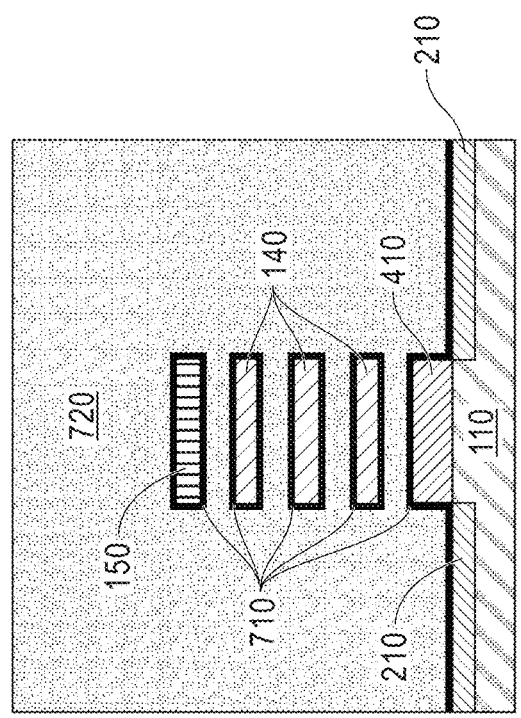
FIG. 7B depicts a cross-sectional view, along section line B of FIG. 7A.

FIG. 7A depicts a top-down view of fabrication steps, in accordance with an embodiment of the present invention. FIG. 7B depicts a cross-sectional view along section line B of FIG. 7A and FIG. 7C depicts a cross-sectional view along section line C of FIG. 7A, in accordance with an embodiment of the present invention. FIGS. 7A-C depict (i) the removal of each sacrificial gate structure (i.e., gate cap 320, dummy gate 310) and each recessed sacrificial semiconductor material nanosheet (i.e., sacrificial semiconductor material layer 130), and (ii) forming a functional gate structure (i.e., gate conductor portion 720, gate dielectric portion 710) around a physically exposed surface of each (i) semiconductor channel material nanosheet (i.e., semiconductor channel material layer 140) and (ii) hardmask layer 150.

After providing ILD material 610, gate cap 320 and dummy gate 310 are each removed to provide a gate cavity (not specifically shown). The removal of gate cap 320 and dummy gate 310 can be performed utilizing one or more anisotropic etching processes.

Next, hardmask layer 150 and each semiconductor channel material nanosheet (i.e., semiconductor channel material layer 140) is suspended by selectively etching each recessed sacrificial semiconductor material nanosheet (i.e., sacrificial semiconductor material layer 130) relative to hardmask layer 150 and each semiconductor channel material nanosheet (i.e., semiconductor channel material layer 140). A functional gate structure (gate conductor portion 720, gate dielectric portion 710) is then formed in each gate cavity and surrounding a physically exposed surface of hardmask layer 150 and each semiconductor channel material nanosheet (i.e., semiconductor channel material layer 140). By "functional gate structure" it is meant a permanent gate structure used to control output current (i.e., flow of carriers in the channel) of a semiconducting device through electrical or magnetic fields. Although a single functional gate structure is described and illustrated, a plurality of functional gate structures can be formed (e.g., as depicted in FIGS. 10C and 11B).

The functional gate structure (gate conductor portion 720, gate dielectric portion 710) may include gate dielectric portion 710 and gate conductor portion 720. Gate dielectric portion 710 may include a gate dielectric material. The gate dielectric material that provides gate dielectric portion 710 can be an oxide, nitride, and/or oxynitride. In one example, the gate dielectric material that provides gate dielectric portion 710 can be a high-k material having a dielectric constant greater than silicon dioxide. Exemplary high-K dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as gate dielectric portion 710.

The gate dielectric material used in providing gate dielectric portion 710 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing gate dielectric portion 710 can have a thickness in a range from 1 nm to 10 nm. Other thicknesses that are lesser than, or greater than, the aforementioned thickness range can also be employed for the gate dielectric material that may provide gate dielectric portion 710.

Gate conductor portion 720 can include a gate conductor material. The gate conductor material used in providing gate conductor portion 720 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide), or multilayered combinations thereof. In one embodiment, gate conductor portion 720 may comprise an nFET gate metal. In another embodiment, gate conductor portion 720 may comprise a pFET gate metal. When multiple gate cavities are formed, it is possible to form a nFET in a first set of the gate cavities and wrapping around some of the semiconductor channel material nanosheet (e.g., semiconductor channel material layer 140) and a pFET in a second set of the gate cavities and wrapping around some of the semiconductor channel material nanosheet (e.g., semiconductor channel material layer 140).

The gate conductor material used in providing gate conductor portion 720 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing gate conductor portion 720 can have a thickness from 50 nm to 200 nm. Other thicknesses that are lesser than, or greater than, the aforementioned thickness range can also be employed for the gate conductor material used in providing gate conductor portion 720.

The functional gate structure (gate conductor portion 720, gate dielectric portion 710) can be formed by providing a functional gate material stack of the gate dielectric material, and the gate conductor material. A planarization process may follow the formation of the functional gate material stack.

Figure 8A:
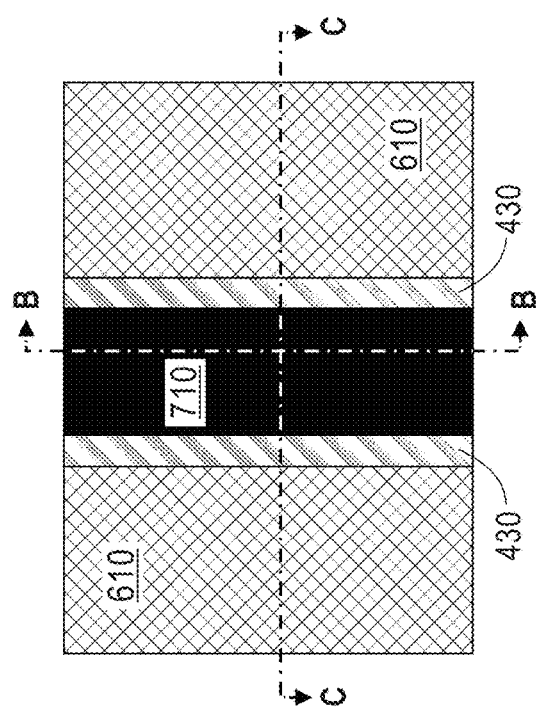
FIG. 8A depicts a top-down view.
Figure 8C:
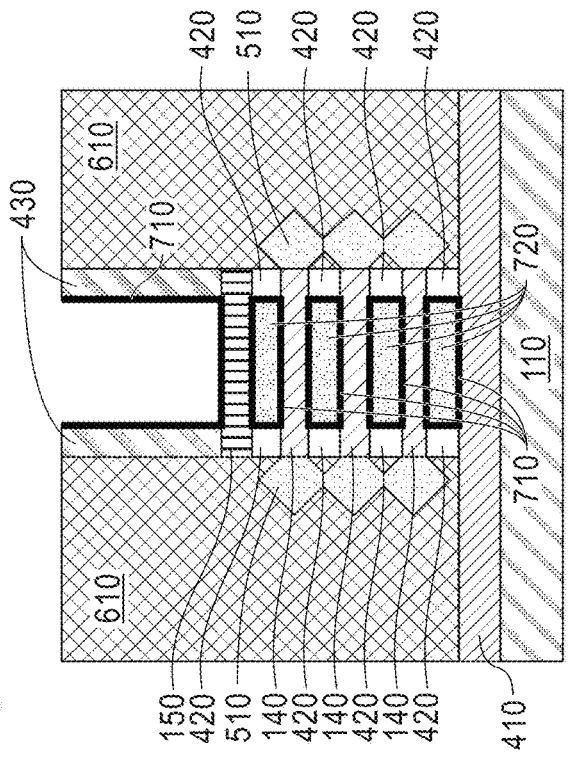
FIG. 8C depicts a cross-sectional view, along section line C of FIG. 8A, of a process of receding a gate conductor portion, in accordance with an embodiment of the present invention.
Figure 8B:
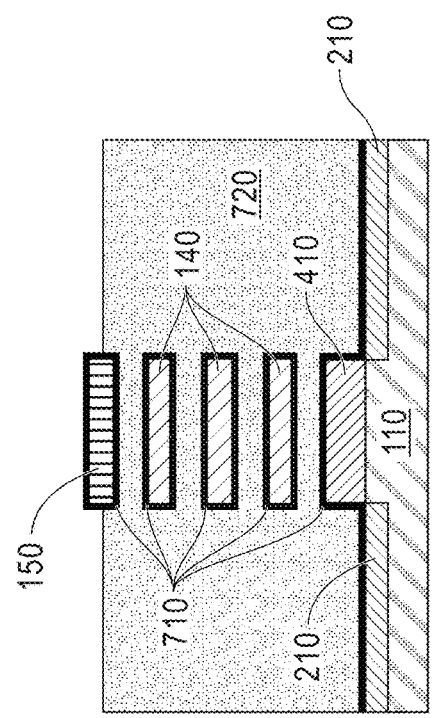
FIG. 8B depicts a cross-sectional view, along section line B of FIG. 8A.

FIG. 8A depicts a top-down view of fabrication steps, in accordance with an embodiment of the present invention. FIG. 8B depicts a cross-sectional view along section line B of FIG. 8A and FIG. 8C depicts a cross-sectional view along section line C of FIG. 8A, in accordance with an embodiment of the present invention. FIGS. 8A-C depict the recession of gate conductor portion 720.

Gate conductor portion 720 is recessed such that the top surface of gate conductor portion 720 is coplanar with a portion of hardmask layer 150, creating a gate opening. In some embodiments, subsequent to recessing gate conductor portion 720, the top surface of gate conductor portion 720 is coplanar with the center of hardmask layer 150. The removal of gate conductor portion 720 can be performed utilizing one or more anisotropic etching processes.

Figure 9A:
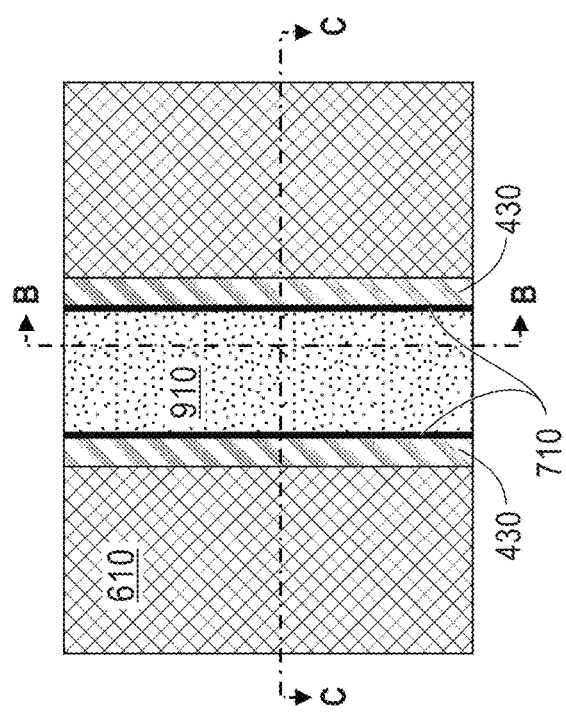
FIG. 9A depicts a top-down view.
Figure 9C:
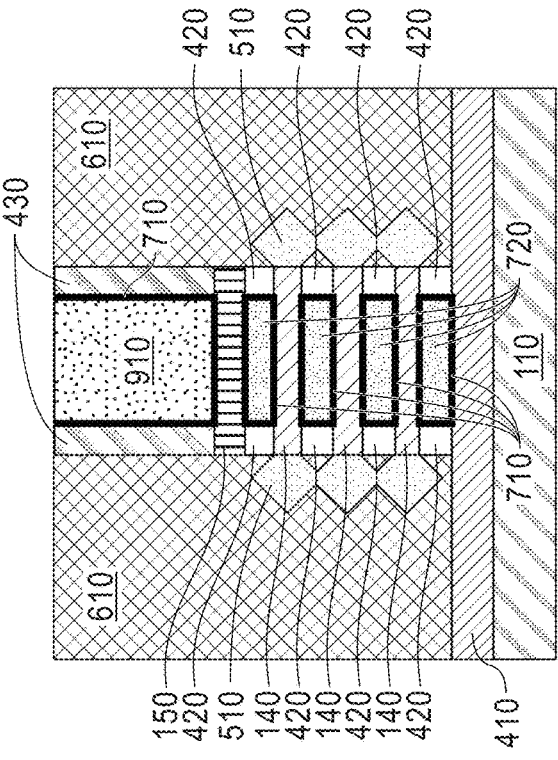
FIG. 9C depicts a cross-sectional view, along section line C of FIG. 9A, of a process of forming a self-aligned source/drain contact (SAC) cap, in accordance with an embodiment of the present invention.
Figure 9B:
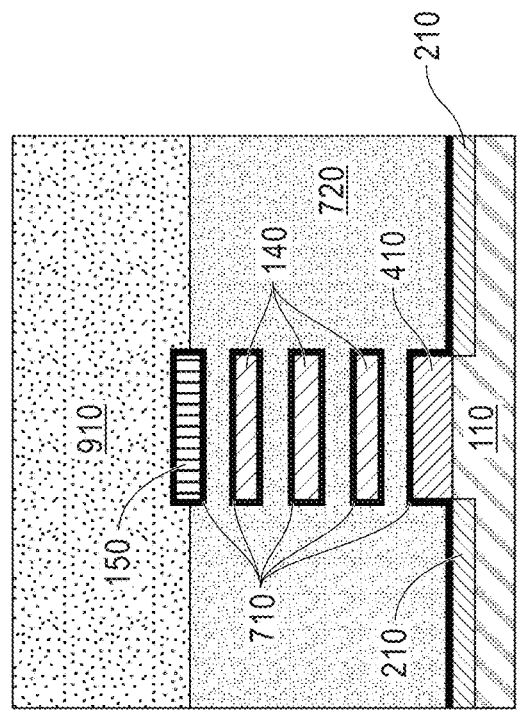
FIG. 9B depicts a cross-sectional view, along section line B of FIG. 9A.

FIG. 9A depicts a top-down view of fabrication steps, in accordance with an embodiment of the present invention. FIG. 9B depicts a cross-sectional view along section line B of FIG. 9A and FIG. 9C depicts a cross-sectional view along section line C of FIG. 9A, in accordance with an embodiment of the present invention. FIGS. 9A-C depict the formation of a self-aligned source/drain contact (SAC) cap 910.

SAC cap 910 is formed within the gate opening created by the recession of gate conductor portion 720 on gate dielectric portion 710.

SAC cap 910 may be composed of a dielectric material such as silicon nitride. In general, the dielectric material that comprises SAC cap 910 may include any dielectric material including, for example, a dielectric nitride, dielectric oxide, and/or dielectric oxynitride. More specifically, the SAC cap 910 may be, for example, silicon oxide, SiN, SiBCN, SiBN, SiOCN, SiON, SiCO, or SiC. In one example, SAC cap 910 is composed of a non-conductive low capacitance dielectric material such as SiOC.

The dielectric material that provides the SAC cap 910 may be provided by a deposition process including, for example, chemical vapor deposition (CVD), plasma enhanced chemical vapor deposition (PECVD), or physical vapor deposition (PVD). A planarization process or an etch back process follows the deposition of the dielectric material that provides SAC cap 910. As is shown in FIG. 9C. SAC cap 910 has a topmost surface that is coplanar with a topmost surface of gate dielectric portion 710, gate spacers 430, and ILD material 610.

Figure 10A:
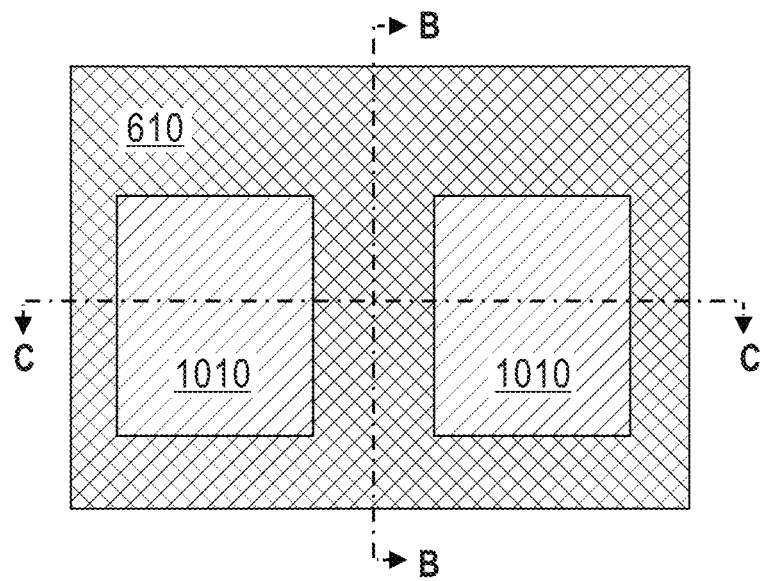
FIG. 10A depicts a top-down view.
Figure 10B:
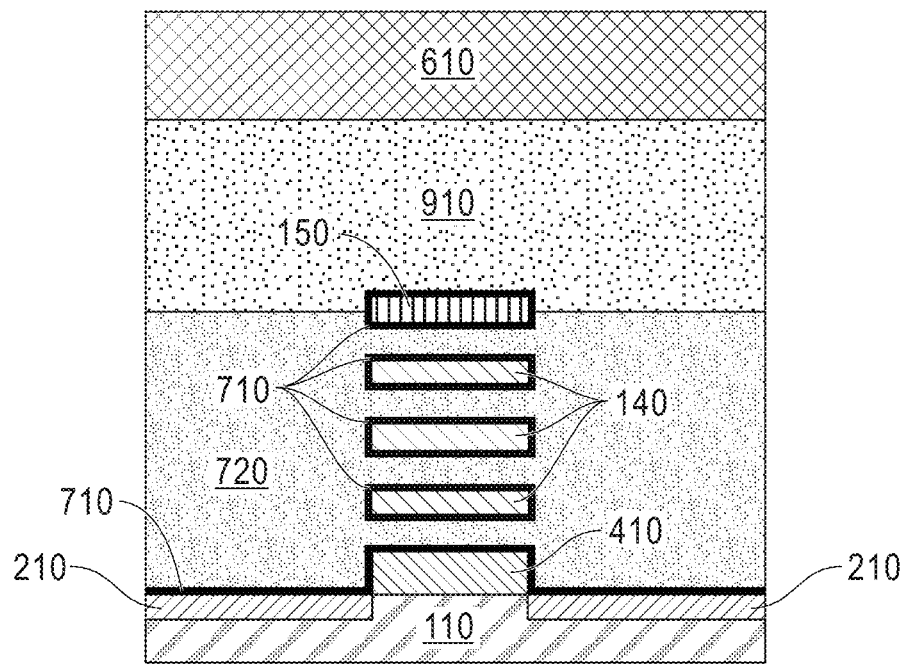
FIG. 10B depicts a cross-sectional view, along section line B of FIG. 10A.
Figure 10C:
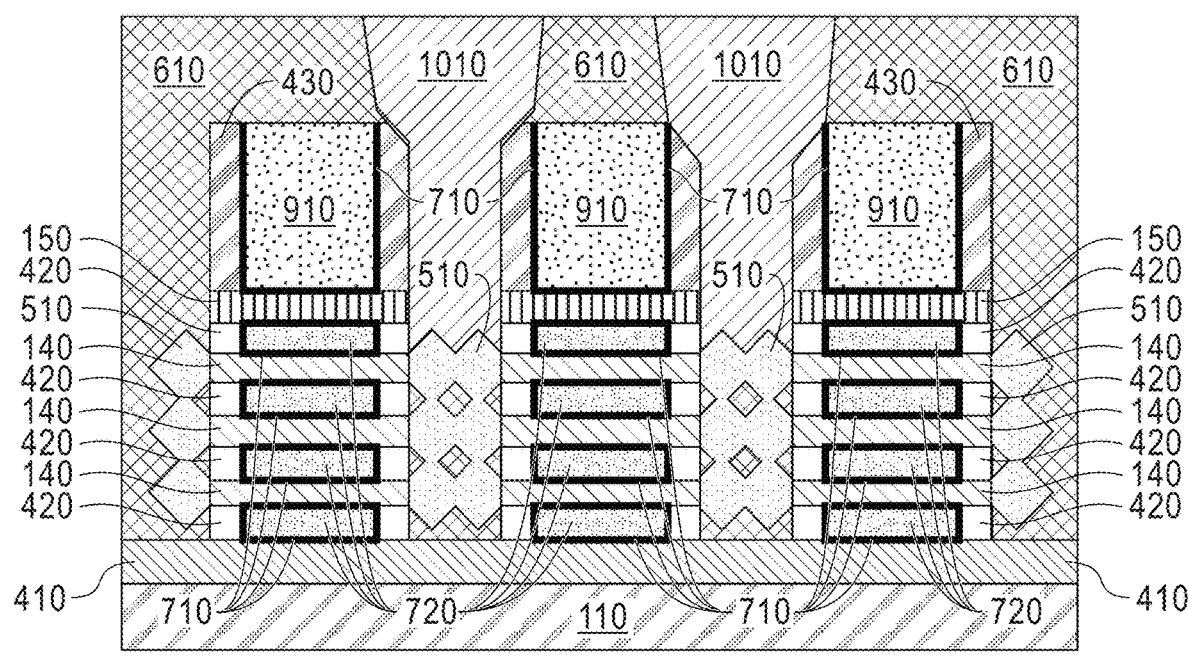
FIG. 10C depicts a cross-sectional view, along section line C of FIG. 10A, of a process of forming additional ILD material and an SAC, in accordance with an embodiment of the present invention.

FIG. 10A depicts a top-down view of fabrication steps, in accordance with an embodiment of the present invention. FIG. 10B depicts a cross-sectional view along section line B of FIG. 10A and FIG. 10C depicts a cross-sectional view along section line C of FIG. 10A, in accordance with an embodiment of the present invention. FIGS. 10A-C depict (i) the formation of an additional layer of ILD material 610 on the device and (ii) the formation of SAC 1010 with a robust SAC dielectric cap on the gate due to the presence of SAC cap 910.

It should be noted that FIGS. 10A-C are depicting additional gate structures (three in total), whereas previous Figures only depicted a single gate structure. Any number of gate structures are contemplated in accordance with embodiments of the present invention and a similar process may be used to fabricate such a device.

The additional ILD material 610 may be composed of silicon dioxide, undoped silicate glass (USG), fluorosilicate glass (FSG), borophosphosilicate glass (BPSG), a spin-on low-κ dielectric layer, a chemical vapor deposition (CVD) low-k dielectric layer or any combination thereof. The term "low-κ" as used throughout the present application denotes a dielectric material that has a dielectric constant of less than silicon dioxide. In another embodiment, a self-planarizing material such as a spin-on glass (SOG) or a spin-on low-κ dielectric material such as SiLK™ can be used as ILD material 610. The use of a self-planarizing dielectric material as ILD material 610 may avoid the need to perform a subsequent planarizing step.

In one embodiment, additional ILD material 610 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD material 610, a planarization process or an etch back process follows the deposition of the dielectric material that provides ILD material 610. As is shown in FIG. 10C, additional ILD material 610 is present atop the device of a desired height.

After providing ILD material 610, contact trenches are formed. As depicted in FIGS. 10A and 10C, the contact trenches extend beyond the sides of source/drain region 510.

The contact trenches each have a depth as depicted in FIG. 10C. the contact trenches result in exposing a top surface of source/drain region 510.

In some embodiments of the invention, each contact trench may be formed by a selective etching process that selectively removes ILD material 610. In some embodiments, this etching can be performed using an anisotropic etch such as reactive ion etching (RIE). The etch can be performed using one or more etching processes that selectively affect ILD material 610. Masking material (not shown) may be applied to the top of the device prior to etching each contact trench which resists etching and can be utilized to form the desired shape of the contact trench, such as, for example as the shape depicted in FIG. 10A. In some embodiments, the masking material may be a photoresist which has been patterned using photolithography.

SAC 1010 may be formed by, for example, depositing (e.g., by PVD), a metal layer (e.g., titanium) on exposed surfaces of source/drain region 510. The metal layer may be conformally formed so as to conform to a surface of source/drain region 510. A conventional silicide process may be employed. For example, the device may be exposed to high temperatures in order to promote the chemical reactions between the metal layer (e.g., titanium) and the surface of source/drain region 510, and form a silicide layer (not shown). In some embodiments, the heating process may be performed prior to the deposition of SAC 1010. In other embodiments, the heating process may be performed subsequent to the deposition of SAC 1010. In some embodiments, the heating process may be skipped. Any deposition process may be used for the formation of the metal layer including, for example, chemical vapor deposition (CVD), plasma enhanced chemical vapor deposition (PECVD), physical vapor deposition (PVD), sputtering, or atomic layer deposition. In other embodiments, co-evaporation techniques may be utilized to form SAC 1010. Co-evaporation consists of the simultaneous deposition of metal and silicon under high vacuum conditions. In co-evaporation, possible heating techniques used include electron beam, rf induction, with a laser, or by resistive heating. In yet other embodiments, known sputter deposition or chemical vapor deposition techniques may be utilized to form the silicide layer. In one embodiment of the present application, silicide can have a thickness in a range from 1 nm to 5 nm. Other thicknesses that are lesser than, or greater than, the aforementioned thickness range can also be employed.

In some embodiments, SAC 1010 is deposited such that SAC 1010 surrounds the silicide layer and fills the remaining area of the contact trench. SAC 1010 may be in direct contact with the silicide layer, source drain region 510, inner spacers 420, hardmask layer 150, gate spacers 430, gate dielectric portion 710, and ILD material 610.

SAC 1010 can include a conductive material including, for example, titanium, tantalum, hafnium, zirconium, niobium, cobalt, tungsten, or alloys comprising carbon. However, other materials are applicable as well.

SAC 1010 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, SAC 1010 can have a thickness from 50 nm to 200 nm. Other thicknesses that are lesser than, or greater than, the aforementioned thickness range can also be employed for SAC 1010.

As the metal gate (e.g., gate conductor portion 720) is only present around the nanosheet, the parasitic capacitance between the metal gate and the source/drain contact (e.g., SAC 1010) is largely eliminated. Further, the entire gate opening above the hardmask layer 150 can be used as an SAC cap, resulting in a simpler contact trench formation with less concern for corner erosion of the SAC cap.

Figure 11A:
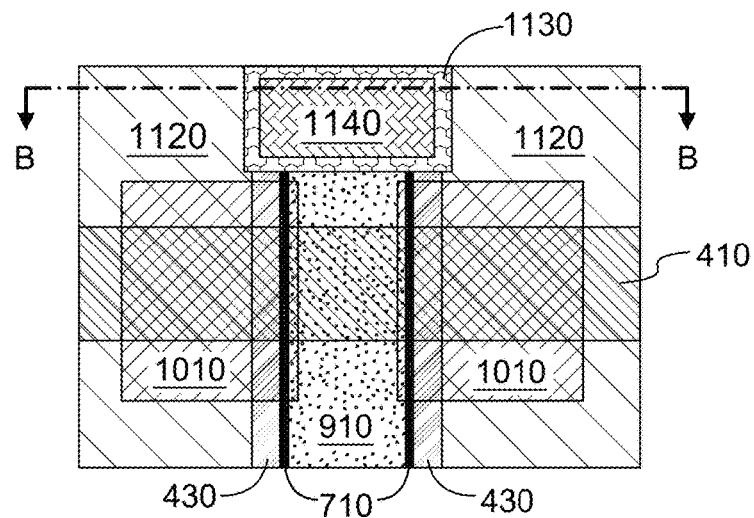
FIG. 11A depicts a top-down view of a backside of the device and FIG. 11B depicts a cross-sectional view, along section line B of FIG. 11A, of a process of flipping the device, bonding the device to a wafer holder, thinning down the semiconductor substrate, forming a dielectric layer, forming a dielectric spacer, and forming a gate contact, in accordance with an embodiment of the present invention.
Figure 11B:
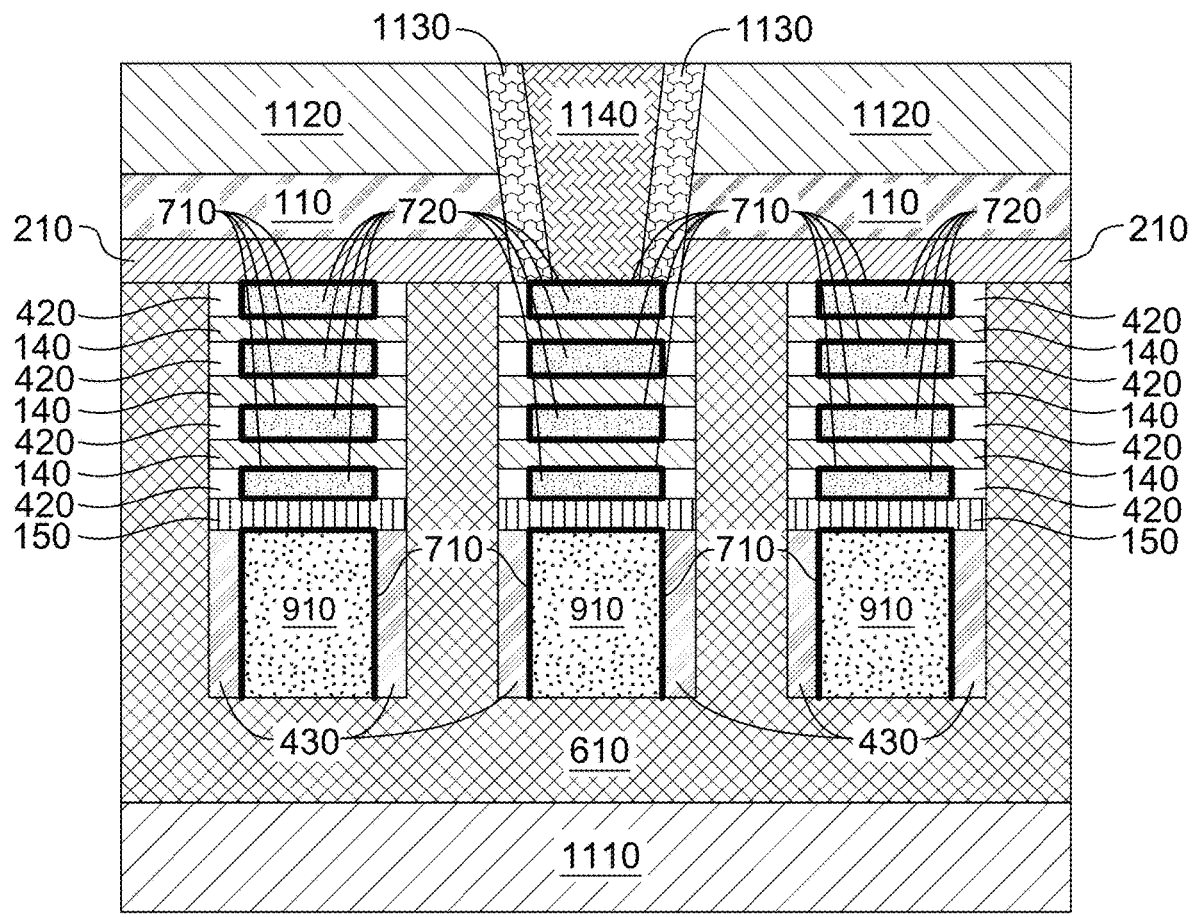

FIG. 11A depicts a top-down view of a backside of the device of fabrication steps, in accordance with an embodiment of the present invention. FIG. 11B depicts a cross-sectional view along section line B of FIG. 11A, in accordance with an embodiment of the present invention. FIG. 11A is illustrated as semi-transparent, for illustrative purposes only. As depicted in FIG. 11A, isolation layer 410, gate spacers 430, gate dielectric portion 710, and SAC 1010 are beneath dielectric layer 1120, dielectric spacer 1130, and/or gate contact 1140. These layers are presented for illustrative purposes only. FIGS. 11A-B depict the flipping of the device and bonding of the device to wafer holder 1110, thinning down of semiconductor substrate 110, formation of dielectric layer 1120, formation of dielectric spacer 1130, and the formation of gate contact 1140.

In general, the formation of gate contact 1140 is for use with backside power distribution and dielectric spacer 1130 is used to isolate gate contact 1140 from the silicon substrate.

The wafer containing the device is flipped and bonded to wafer holder 1110 or another wafer. Wafer holder 1110 holds a wafer including a plurality of semiconductor chips. The wafer is held in a manner that a top surface of the wafer faces downward.

Subsequent to flipping the wafer, the wafer is bonded to wafer holder 1110 or another wafer. A variety of bonding means may be used such as, for example, pressure bonding for press-bonding the device to the wafer holder 1110 or a heat bonding approach for utilizing heat to bond the wafer to wafer holder 1110.

After flipping the device and bonding the device to a wafer holder 1110, a planarization process or an etch back process may be used to thin down, or otherwise recess, semiconductor substrate 110 to a desire height.

Next, a dielectric layer 1120 (e.g., an oxide layer) may be formed on exposed portions of semiconductor substrate 110.

In some embodiments, dielectric layer 1120 is composed of an oxide of at least one rare earth metal. Rare earth metals that can be used herein as a component of the lattice matched epitaxial oxide interlayers include scandium, yttrium, a lanthanide (i.e., La, Ce, Pr, Nd, Pm, Sm, Eu, Gd, Tb, Dy, Ho, Er, Tm, Yb, and Lu), or any combination thereof.

In one embodiment, the oxide of at least one rare earth metal that may provide the dielectric layer 1120 is a binary compound. In another embodiment, the oxide of at least one rare earth metal that may provide the dielectric layer 1120 is a ternary compound. Examples of oxides of at least one rare earth metal that can be used to provide the dielectric layer 1120 include, but are not limited to $(La_xY_{1-x})_2O_3$ wherein x is 0.33 $Gd_2O_3$, $Er_2O_3$, $Dy_2O_3$, $Ho_2O_3$, $Tm_2O_3$, $Lu_2O_3$ and $CeO_2$. In addition to $(La_xY_{1-x})_2O_3$, other ternary compounds having the formula $(RE^1_xRE^2_{1-x})_2O_3$ wherein $RE^1$ is a first rare earth metal and $RE^2$ is a second rare earth metal that differs from the first rare earth metal can be used.

In one example, the dielectric layer 1120 is lanthanum (La) and oxygen (O) containing material, which has a lattice dimension that can be closely matched to a silicon lattice. In one embodiment, the dielectric layer 1120 is lanthanum (La) and oxygen (O) containing material, e.g., $(La_xY_{1-x})_2O_3$ alloy, and may be epitaxially deposited.

The terms "epitaxial growth," "epitaxial deposition." "epitaxially formed," and/or "epitaxially grown" mean the growth of a material (e.g., semiconductor material) on a deposition surface of a material, in which the material being grown has substantially the same crystalline characteristics as the material of the deposition surface. The term "epitaxial material" denotes a semiconductor material that has substantially the same crystalline characteristics as the semiconductor material that it has been formed on, i.e., epitaxially formed on. In an epitaxial deposition process, the chemical reactants provided by the source gases are controlled and the system parameters are set so that the depositing atoms arrive at the deposition surface of the growth surface with sufficient energy to move around on the surface and orient themselves to the crystal arrangement of the atoms of the deposition surface. Therefore, an epitaxial material has the same crystalline characteristics as the deposition surface on which it is formed. For example, an epitaxial film deposited on a {100} crystal surface, e.g., the epitaxial oxide, will take on a {100} orientation.

Epitaxial growth process apparatuses that are suitable for use in forming the dielectric layer 1120 are molecular beam epitaxy (MBE), but others methods like rapid thermal chemical vapor deposition (RTCVD), low-energy plasma deposition (LEPD), ultra-high vacuum chemical vapor deposition (UHVCVD), atmospheric pressure chemical vapor deposition (APCVD) may be used. The temperature for epitaxial deposition typically ranges from 450° C. to 900° C. Although higher temperature typically results in faster deposition, the faster deposition may result in crystal defects and film cracking.

A number of different sources may be used for the deposition of the lattice matched dielectric layer 1120. In some embodiments, e.g., when the dielectric layer 1120 is composed of a lanthanum and oxygen containing material, e.g., metastable $(La_xY_{1-x})_2O_3$ alloy, the dielectric layer 1120 may be formed using MBE deposition, using La and Y metals with added oxygen. In MBE, material is sublimated (or evaporated in the case of a liquid source) from effusion cells, thus forming molecular beams that are incident upon a heated sample, i.e., deposition surface. In MBE, the molecules of the deposited material land on the surface of the substrate, condense, and build up slowly and systematically, i.e., providing epitaxial growth.

In some embodiments, the dielectric layer 1120 is deposited on the exposed surface of semiconductor substrate 110.

Next, one or more trenches may be formed by an etching process, such as reactive-ion etching (RIE), laser ablation, or any etch process which can be used to selectively remove a portion of material such as dielectric layer 1120, semiconductor substrate 110, isolation layer 410, and gate dielectric portion 710. A hardmask (not shown) may be patterned using photoresist to expose areas of dielectric layer 1120, semiconductor substrate 110, isolation layer 410, and gate dielectric portion 710 where trenches are desired and the hardmask may be utilized during the etching process in the creation of the trenches. The etching process only removes portions of dielectric layer 1120, semiconductor substrate 110, isolation layer 410, and gate dielectric portion 710 not protected by the hardmask and the etching process stops at gate conductor portion 720.

In some embodiments, subsequent to the formation of the trenches, the hardmask is removed. In general, the process of removing the hardmask involves the use of an etching process such as RIE, laser ablation, or any etch process which can be used to selectively remove a portion of material, such as the hardmask. In some embodiments, prior to the removal of the hardmask, the photoresist (not shown) is removed. The process of removing the photoresist is similar to that of the process of removing the hardmask.

Dielectric spacer 1130 may be formed by depositing dielectric spacer material on exposed surfaces and then etching the dielectric spacer material. One example of a dielectric spacer material that may be employed in embodiments of the present invention is silicon nitride. In general, dielectric spacer 1130 may comprise any dielectric spacer material including, for example, a dielectric nitride, dielectric oxide, and/or dielectric oxynitride. More specifically, the dielectric spacer 1130 material may be, for example, SiBCN, SiBN, SiOCN, SiON, SiCO, or SiC. In one example, the dielectric spacer material that comprises dielectric spacer 1130 is composed of a non-conductive low capacitance dielectric material such as SiO2.

The dielectric spacer material that provides the dielectric spacer 1130 may be provided by a deposition process including, for example, chemical vapor deposition (CVD), plasma enhanced chemical vapor deposition (PECVD), or physical vapor deposition (PVD). The etch used to provide the dielectric spacer 1130 may comprise a dry etching process such as, for example, reactive ion etching.

In order to create dielectric spacer 1130, horizontal portions of the dielectric spacer material layer are removed. More particularly, portions of dielectric spacer material on the top surfaces of dielectric layer 1120 and gate conductor portion 720 are removed such that what remains of the dielectric spacer material layer is present on the sidewalls of dielectric layer 1120, semiconductor substrate 110, and isolation layer 410. The dielectric spacer material layer may be removed utilizing a directional or anisotropic etching process such as reactive ion etching (RIE). In one example, gas cluster ion beam etching (IBE) may be used to remove the dielectric spacer material layer from the top surfaces of dielectric layer 1120 and gate conductor portion 720. The removal of the dielectric spacer material layer, the top surfaces of dielectric layer 1120 and gate conductor portion 720 re-exposes the top surfaces of dielectric layer 1120 and gate conductor portion 720.

Gate contact 1140 may be formed by, for example, depositing (e.g., by PVD), a metal layer (e.g., titanium) on exposed surfaces of gate conductor portion 720. The metal layer may be conformally formed so as to conform to a surface of gate conductor portion 720. A conventional silicide process may be employed. For example, the device may be exposed to high temperatures in order to promote the chemical reactions between the metal layer (e.g., titanium) and the surface of gate conductor portion 720, and form a silicide layer (not shown). In some embodiments, the heating process may be performed prior to the deposition of gate contact 1140. In other embodiments, the heating process may be performed subsequent to the deposition of gate contact 1140. Any deposition process may be used for the formation of the metal layer including, for example, chemical vapor deposition (CVD), plasma enhanced chemical vapor deposition (PECVD), physical vapor deposition (PVD), sputtering, or atomic layer deposition. In other embodiments, co-evaporation techniques may be utilized to form SAC 1010. Co-evaporation consists of the simultaneous deposition of metal and silicon under high vacuum conditions. In co-evaporation, possible heating techniques used include electron beam, rf induction, with a laser, or by resistive heating. In yet other embodiments, known sputter deposition or chemical vapor deposition techniques may be utilized to form the silicide layer. In one embodiment of the present application, silicide can have a thickness in a range from 1 nm to 5 nm. Other thicknesses that are lesser than, or greater than, the aforementioned thickness range can also be employed.

In some embodiments, gate contact 1140 is deposited such that gate contact 1140 surrounds the silicide layer and fills the remaining area of the contact trench. Gate contact 1140 may be in direct contact with the silicide layer, gate conductor portion 720 and dielectric spacer 1130.

Gate contact 1140 can include a conductive material including, for example, titanium, tantalum, hafnium, zirconium, niobium, or allows comprising carbon. However, other materials are applicable as well.

Gate contact 1140 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, SAC 1010 can have a thickness from 50 nm to 200 nm. Other thicknesses that are lesser than, or greater than, the aforementioned thickness range can also be employed for SAC 1010.

Subsequent to the formation of gate contact 1140, the wafer may be released from wafer holder 1110 and flipped over (not depicted) such that gate contact 1140 is on the bottom of the wafer and operates in accordance with, for example, a backside power rail distribution network.

The resulting semiconductor structure includes a plurality of stacked and suspended semiconductor channel material nanosheets (e.g., semiconductor channel material layer 140) located above semiconductor substrate 110. A functional gate structure (gate conductor portion 720, gate dielectric portion 710) is located surrounding a portion of each semiconductor channel material nanosheet (e.g., semiconductor channel material layer 140) of the plurality of stacked and suspended semiconductor channel material nanosheets (e.g., semiconductor channel material layer 140). Source/drain region 510 is located on each side of the functional gate structure (gate conductor portion 720, gate dielectric portion 710) and physically contacting sidewalls of each semiconductor channel material nanosheet (e.g., semiconductor channel material layer 140) of the plurality of stacked and suspended semiconductor channel material nanosheets. A contact (SAC 1010) contacts a top surface of source/drain region 510. The device further includes gate spacers 430 contacting sidewalls of gate dielectric portion 710 along SAC cap 910. Inner spacers 420 are located on an outer portion of each semiconductor channel material nanosheet (e.g., semiconductor channel material layer 140) of the plurality of stacked and suspended semiconductor channel material nanosheets. In the depicted structure, the functional gate structure (gate conductor portion 720, gate dielectric portion 710) wraps around each suspended semiconductor channel material nanosheet (e.g., semiconductor channel material layer 140) with the gate conductor portion 720 stopping at a hardmask layer 150 located on the semiconductor channel material nanosheet. An SAC cap 910 is located on the gate dielectric portion 710 above the hardmask layer 150. An isolation layer 410 is present atop semiconductor substrate 110. A backside gate contact 1140 passes through a dielectric layer 1120, the semiconductor substrate 110, isolation layer 410, and gate dielectric portion 710 to make contact with gate conductor portion 720, the dielectric layer 1120 beneath the semiconductor substrate 110. A dielectric spacer 1130 prevents the gate contact 1140 from making contact with dielectric layer 1120, semiconductor substrate 110, and isolation layer 410. An STI layer 210 is present on semiconductor substrate 110 in areas outside of the region occupied by the stacked and suspended semiconductor channel material nanosheets. ILD material 610 is present on the device and a top surface of the ILD material 610 is coplanar with a top surface of SAC 1010.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A semiconductor structure comprising:
  a plurality of stacked and suspended semiconductor channel material nanosheets located above a semiconductor substrate;
  a functional gate structure surrounding a portion of each semiconductor channel material nanosheet of the plurality of stacked and suspended semiconductor channel material nanosheets;
  a dielectric nanosheet on top of and covering a top surface of the functional gate structure, wherein: with respect to the functional gate structure, the dielectric nanosheet directly contacts only a gate dielectric portion of the functional gate structure;
  a source/drain region on each side of the functional gate structure and physically contacting sidewalls of each semiconductor channel material nanosheet of the plurality of stacked and suspended semiconductor channel material nanosheets;
  a self-aligned contact region directly contacting: (i) a sidewall of the dielectric nanosheet, (ii) a sidewall of a second dielectric nanosheet, and (iii) a portion of each source/drain region, wherein the second dielectric nanosheet is covering a top surface of a second functional gate structure surrounding a portion of each semiconductor channel material nanosheet of a second plurality of stacked and suspended semiconductor channel material nanosheets; and a gate contact contacting a portion of the functional gate structure, the gate contact passing through the semiconductor substrate.

2. The semiconductor structure of claim 1, further comprising an isolation layer on the semiconductor substrate and beneath the functional gate structure.

3. The semiconductor structure of claim 1, further comprising a dielectric spacer on sidewalls of the gate contact.

4. The semiconductor structure of claim 1, wherein each of the plurality of stacked and suspended semiconductor channel material nanosheets comprises at least three nanosheets.

5. The semiconductor structure of claim 1, further comprising an interlevel dielectric (ILD) material with a top surface coplanar with a top surface of the self-aligned contact region.

6. The semiconductor structure of claim 1, further comprising inner spacers contacting sidewalls of the functional gate structure and located on an outer portion of each semiconductor material nanosheet of the plurality of stacked and suspended semiconductor channel material nanosheets.

7. The semiconductor structure of claim 1, wherein the sidewalls of each semiconductor channel material nanosheet of the plurality of stacked and suspended semiconductor channel material nanosheets are vertically aligned to one another.

8. The semiconductor structure of claim 1, wherein each functional gate structure comprises (i) the gate dielectric portion physically contacting the semiconductor channel material nanosheet and (ii) a gate conductor portion physically contacting the gate dielectric portion.

9. The semiconductor structure of claim 1, wherein the semiconductor substrate and each semiconductor channel material nanosheet is composed of a same semiconductor material.

10. The semiconductor structure of claim 2, further comprising a region that includes a shallow trench isolation (STI) material that is physically contacting the semiconductor substrate and the isolation layer.

11. A method for forming a semiconductor structure, the method comprising:
   providing a nanosheet stack of (i) alternating nanosheets of a sacrificial semiconductor material nanosheet and a semiconductor channel material nanosheet and (ii) a dielectric nanosheet as a top layer of the nanosheet stack, the nanosheet stack located above a semiconductor substrate, wherein a dummy gate with a gate cap and spacers on sidewalls of the dummy gate and the gate cap straddle over the nanosheet stack;
   recessing end portions of each of the sacrificial semiconductor material nanosheets to provide a gap between each of the semiconductor channel material nanosheets;
   forming a dielectric spacer material layer within each gap;
   forming a source/drain region by epitaxial growth of a semiconductor material on physically exposed sidewalls of each semiconductor channel material nanosheet;
   removing the dummy gate and the gate cap;
   removing each sacrificial semiconductor material nanosheet to suspend each semiconductor channel material nanosheet and the dielectric nanosheet;
   forming a functional gate structure in regions occupied by each sacrificial semiconductor material nanosheet, wherein:
   the functional gate structure wraps around each suspended semiconductor channel material nanosheet; and
   with respect to the functional gate structure, the dielectric nanosheet directly contacts only a gate dielectric portion of the functional gate structure;
   forming a self-aligned contact region, wherein the self-aligned contact region directly contacts: (i) a sidewall of the dielectric nanosheet, (ii) a sidewall of a second dielectric nanosheet, and (iii) the source/drain region and is laterally adjacent to the spacers and the dielectric nanosheet, wherein the second dielectric nanosheet is covering a top surface of a second functional gate structure surrounding a portion of each semiconductor channel material nanosheet of a second plurality of stacked and suspended semiconductor channel material nanosheets; and
   forming a gate contact region in a trench in the semiconductor substrate, the gate contact region contacting the functional gate structure.

12. The method of claim 11, further comprising:
providing a bottom sacrificial semiconductor material layer on the semiconductor substrate; and
subsequent to providing the nanosheet stack:
   removing the bottom sacrificial semiconductor material layer; and
   forming an isolation layer on the semiconductor substrate.

13. The method of claim 11, further comprising:
forming interlevel dielectric (ILD) material above the source/drain region and above an adjacent region.

14. The method of claim 11, wherein forming the functional gate structure comprises:
additionally forming the functional gate structure in regions occupied by the dummy gate and the gate cap; and
recessing a gate conductor portion of the functional gate structure to expose the dielectric nanosheet.

15. The method of claim 14, further comprising:
subsequent to recessing the gate conductor portion of the functional gate structure, forming a dielectric cap in the regions occupied by the dummy gate and the gate cap.

16. The method of claim 13, further comprising:
prior to forming the self-aligned contact region, forming additional interlevel dielectric (ILD) material on the ILD material and the spacers, wherein the self-aligned contact region passes through a trench passing through the ILD material and the additional ILD material.

17. The method of claim 11, wherein forming the gate contact region in the trench in the semiconductor substrate comprises:
flipping a wafer containing the semiconductor structure;
forming the trench in the semiconductor substrate; and
forming the gate contact region in the trench in the semiconductor substrate, the gate contact region contacting the functional gate structure.

18. The method of claim 17, further comprising:
prior to forming the gate contact region in the trench in the semiconductor substrate, forming a gate spacer on sidewalls of the trench in the semiconductor substrate.

19. The method of claim 17, further comprising:
prior to forming the trench in the semiconductor substrate, recessing the semiconductor substrate.

20. The semiconductor structure of claim 1, wherein a top surface of the dielectric nanosheet is above a top surface of the functional gate structure.

* * * * *